(12) United States Patent
Yoshida et al.

(10) Patent No.: US 12,403,500 B2
(45) Date of Patent: Sep. 2, 2025

(54) SUBSTRATE PROCESSING WITH POLYMER-CONTAINING LIQUID

(71) Applicant: SCREEN Holdings Co., Ltd., Kyoto (JP)

(72) Inventors: Yukifumi Yoshida, Kyoto (JP); Yu Yamaguchi, Kyoto (JP); Song Zhang, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 2 days.

(21) Appl. No.: 18/550,643

(22) PCT Filed: Jan. 17, 2022

(86) PCT No.: PCT/JP2022/001426
§ 371 (c)(1),
(2) Date: Sep. 14, 2023

(87) PCT Pub. No.: WO2022/196071
PCT Pub. Date: Sep. 22, 2022

(65) Prior Publication Data
US 2024/0165657 A1    May 23, 2024

(30) Foreign Application Priority Data

Mar. 19, 2021 (JP) ................. 2021-046459
Dec. 24, 2021 (JP) ................. 2021-211618

(51) Int. Cl.
*B05D 1/00* (2006.01)
*B05D 3/02* (2006.01)
*B05D 3/10* (2006.01)

(52) U.S. Cl.
CPC ........... *B05D 1/005* (2013.01); *B05D 3/0254* (2013.01); *B05D 3/10* (2013.01)

(58) Field of Classification Search
CPC ......... B05D 1/005; B05D 3/0254; B05D 3/10
See application file for complete search history.

(56) References Cited

U.S. PATENT DOCUMENTS

| | | | | |
|---|---|---|---|---|
| 5,534,209 A | * | 7/1996 | Moriya | ................. B29C 55/023 428/1.6 |
| 6,027,771 A | * | 2/2000 | Moriya | ................. B29C 55/026 428/317.1 |

(Continued)

FOREIGN PATENT DOCUMENTS

| | | |
|---|---|---|
| JP | 2011-507271 A | 3/2011 |
| JP | 2014-075394 A | 4/2014 |

(Continued)

OTHER PUBLICATIONS

Baumchen, Oliver, et al., "Slippage and nanorheology of thin liquid polymer films". J. Phys.: Condens. Matter 24 (2012) 325102 pp. 1-17.*

(Continued)

*Primary Examiner* — Bret P Chen
(74) *Attorney, Agent, or Firm* — OSTROLENK FABER LLP

(57) ABSTRACT

A substrate processing method includes a polymer-containing liquid supplying step of supplying, to a major surface of a substrate, a polymer-containing liquid that contains an acidic polymer and a solvent dissolving the acidic polymer, a polymer film forming step of rotating the substrate with the polymer-containing liquid adhered to the major surface to spreadingly coat the polymer-containing liquid and form a polymer film, containing the acidic polymer, on the major surface of the substrate, and a rinsing step of supplying, to the major surface of the substrate, a rinse liquid that cleans the major surface of the substrate in a state in which the polymer film is formed on the major surface.

12 Claims, 21 Drawing Sheets

(56) References Cited

U.S. PATENT DOCUMENTS

| | | | |
|---|---|---|---|
| 9,617,205 B2* | 4/2017 | Tabirian | C09K 19/56 |
| 2003/0132193 A1* | 7/2003 | Okamoto | H01L 21/67253 |
| | | | 216/13 |
| 2006/0191625 A1* | 8/2006 | Kapp | B32B 17/10779 |
| | | | 427/407.1 |
| 2007/0009839 A1* | 1/2007 | Harumoto | G03F 7/40 |
| | | | 430/313 |
| 2009/0156452 A1 | 6/2009 | Mui et al. | |
| 2010/0043824 A1 | 2/2010 | Greeley et al. | |
| 2011/0100957 A1* | 5/2011 | Moran | C23C 18/1603 |
| | | | 427/256 |
| 2011/0232726 A1* | 9/2011 | Aiba | H10F 19/804 |
| | | | 427/508 |
| 2015/0279703 A1 | 10/2015 | Ogawa et al. | |
| 2017/0306121 A1* | 10/2017 | Brust | B05D 3/101 |
| 2019/0177656 A1 | 6/2019 | Ishida | |
| 2019/0371599 A1 | 12/2019 | Yoshida et al. | |
| 2021/0165328 A1* | 6/2021 | Akiyama | G03F 7/42 |
| 2024/0047245 A1* | 2/2024 | Tahara | H01L 21/304 |
| 2024/0153779 A1* | 5/2024 | Tahara | H01L 21/6708 |

FOREIGN PATENT DOCUMENTS

| | | |
|---|---|---|
| JP | 2019-212890 A | 12/2019 |
| JP | 2020-072190 A | 5/2020 |
| TW | 201829758 A | 8/2018 |

OTHER PUBLICATIONS

Zhang, Lu, et al., "Liquid Crystal Ordering on Conjugated Polymers Film Morphology for High Performance". Journal of Polymer Science, Part B: Polymer Physics, 2019, 57, 1572-1591.*

DeLongchamp, Dean M., et al., "Influence of a Water Rinse on the Structure and Properties of Poly(3,4-ethylene dioxythiophene): Poly-(styrene sulfonate) Films". Langmuir 2005, 21, 11480-11483.*

Petri, D.F.S., "Characterization of Spin-Coated Polymer Films". J. Braz. Chem. Soc., vol. 13, No. 5, 2002, pp. 695-699.*

Dario, Aline F., et al., "Nanostructures on spin-coated polymer films controlled by solvent composition and polymer molecular weight". Thin Solid Films 524 (2012) 185-190.*

International Preliminary Report on Patentability (Chapter I) mailed Sep. 28, 2023 with a Notification from the International Bureau (Form PCT/IB/326) in corresponding PCT International Application No. PCT/JP2022/001426 in Japanese.

English translation of the International Preliminary Report on Patentability (Chapter I) mailed Sep. 28, 2023 with a Notification from the International Bureau (Form PCT/IB/338) in corresponding PCT International Application No. PCT/JP2022/001426 with a Notification from the International Bureau (Form PCT/IB/338).

International Search Report mailed Apr. 5, 2022 in corresponding PCT International Application No. PCT/JP2022/001426.

* cited by examiner

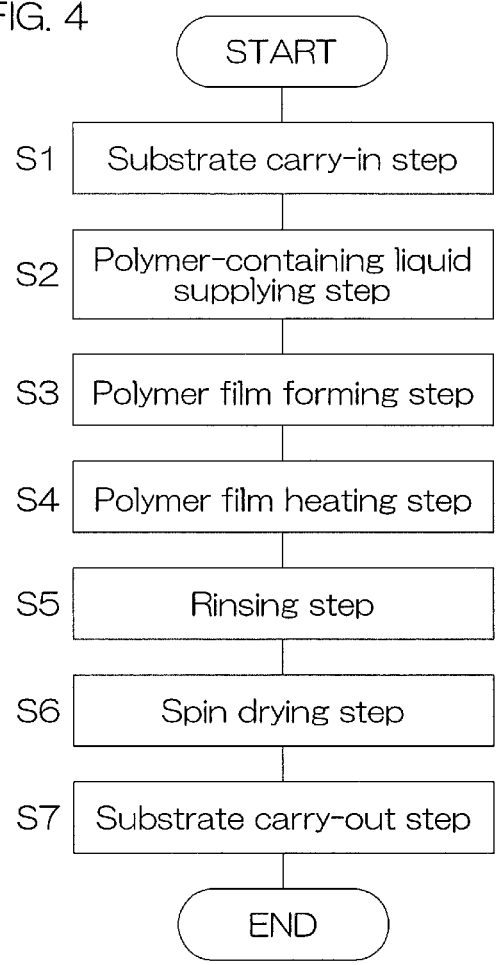

SUBSTRATE PROCESSING WITH POLYMER-CONTAINING LIQUID

CROSS-REFERENCE TO RELATED APPLICATIONS

The present application is a 35 U.S.C. §§ 371 national stage application of International Application No. PCT/JP2022/001426 filed Jan. 17, 2022, which claims priority to Japanese Patent Application No. 2021-046459, filed Mar. 19, 2021, and Japanese Patent Application No. 2021-211618 filed Dec. 24, 2021 the contents of which are incorporated herein by reference.

TECHNICAL FIELD

The present invention relates to a substrate processing method for processing substrates, a substrate processing apparatus for processing substrates, and a polymer-containing liquid for processing substrates.

Examples of substrates to be processed include, for example, semiconductor wafers, substrates for flat panel displays (FPDs) such as liquid crystal displays, organic electroluminescence (EL) displays, etc., substrates for optical disks, substrates for magnetic disks, substrates for magneto-optical disks, substrates for photomasks, ceramic substrates, substrates for solar cells, and the like.

BACKGROUND ART

Metal used in respective members used for substrate processing becomes adhered as foreign matter to a major surface of a substrate. Metal foreign matter adhered to the major surface of the substrate is difficult to remove using DIW (deionized water), etc., and there is a problem of decrease in yield of a semiconductor product.

Japanese Patent Application Publication No. 2020-72190 discloses a substrate processing in which a substrate is immersed in an HPM liquid (hydrochloric hydrogen peroxide mixture) that is a mixed liquid of hydrogen peroxide water and hydrochloric acid to remove metal foreign matter adhered to the substrate. The HPM liquid is as also called an SC2 (standard clean 2) liquid.

CITATION LIST

Patent Literature

Patent Literature 1: Japanese Patent Application Publication No. 2020-72190

SUMMARY OF INVENTION

Technical Problem

With the substrate processing of Japanese Patent Application Publication No. 2020-72190, a tank filled with the HPM liquid is used to immerse the substrate in the HPM liquid. Therefore, a large amount of the HPM liquid is used to remove the metal foreign matter adhered to the substrate and an environmental burden is a problem.

An object of the present invention is thus to provide a substrate processing method, a substrate processing apparatus, and a polymer-containing liquid by which metal foreign matter adhered to a substrate can be removed satisfactorily while reducing the environmental burden.

Solution to Problem

A preferred embodiment of the present invention provides a substrate processing method including a polymer-containing liquid supplying step of supplying, to a major surface of a substrate, a polymer-containing liquid that contains an acidic polymer and a solvent dissolving the acidic polymer, a polymer film forming step of rotating the substrate with the polymer-containing liquid adhered to the major surface to spreadingly coat the polymer-containing liquid and form a polymer film, containing the acidic polymer, on the major surface of the substrate, and a rinsing step of supplying, to the major surface of the substrate, a rinse liquid that cleans the major surface of the substrate in a state in which the polymer film is formed on the major surface.

According to the present substrate processing method, the polymer film is formed by rotating the substrate with the polymer-containing liquid adhered. By an action of the acidic polymer in the polymer film, a metal foreign matter is pulled away from the major surface of the substrate and adsorbed by the polymer film. Thus, by forming the polymer film by the polymer-containing liquid of an amount necessary to cover an entirety of the major surface of the substrate and thereafter cleaning the major surface of the substrate by the rinse liquid to remove the polymer film, the metal foreign matter can be removed satisfactorily from the major surface of the substrate without continuously supplying the polymer-containing liquid to the major surface of the substrate.

Since the metal foreign matter can therefore be removed sufficiently without immersing the substrate in the polymer-containing liquid, a usage amount of the polymer-containing liquid can be reduced. An environmental burden can thereby be reduced.

In a preferred embodiment of the present invention, the polymer-containing liquid further contains an oxidizing agent that is dissolved in the solvent. Also, the polymer film formed in the polymer film forming step further contains the oxidizing agent. Adsorption of the metal foreign matter by the acidic polymer can thus be promoted by an action of the oxidizing agent in the polymer film. The metal foreign matter can therefore be removed even more satisfactorily from the major surface of the substrate.

In a preferred embodiment of the present invention, the polymer-containing liquid is a mixed liquid in which an acidic polymer liquid containing the acidic polymer at 10 wt % and a liquid oxidizing agent containing the oxidizing agent at 30 wt % are mixed at a volume ratio of 1:6. At this ratio, the polymer film can adsorb the metal foreign matter on the major surface of the substrate even more efficiently.

In a preferred embodiment of the present invention, the polymer film forming step incudes a step of forming the polymer film by evaporating a portion of the solvent in the polymer-containing liquid. Since the solvent remains in the polymer film, the solvent functions as a medium for donating and accepting of protons (hydrogen ions) by the acidic polymer in the polymer film. Since the polymer film is formed by evaporating a portion of the solvent from the polymer-containing liquid, the acidic polymer in the polymer film is of higher concentration than in the polymer-containing liquid. Since the acidic polymer of high concentration can be made to act on the metal foreign matter, the metal foreign matter can be adsorbed by the polymer film effectively. Therefore, by using the rinse liquid to remove the polymer film with the metal foreign matter adsorbed thereto, the metal foreign matter can be removed effectively from the major surface of the substrate.

In a preferred embodiment of the present invention, the substrate processing method further includes a polymer film heating step of heating the polymer film after the polymer film forming step.

According to the present substrate processing method, by heating the polymer film, the solvent evaporates from the polymer film. The concentration of the acidic polymer dissolved in the solvent in the polymer film is thereby increased. The acidic polymer of high concentration can thus be made to act on the metal foreign matter. Therefore, by using the rinse liquid to remove the polymer film with the metal foreign matter adsorbed thereto, the metal foreign matter can be removed effectively from the major surface of the substrate. That is, the metal foreign matter can be removed satisfactorily from the major surface of the substrate.

Also, by heating the polymer film at a temperature less than a boiling point of the solvent, the solvent can be evaporated suitably from the polymer film on the substrate. Thus, while increasing the concentration of the acidic polymer dissolved in the solvent in the polymer film, the solvent can be suppressed from evaporating fully and being removed completely from inside the polymer film.

In a preferred embodiment of the present invention, the polymer film heating step includes a fluid heating step of heating the polymer film via the substrate by heating the substrate by supplying a heating fluid to an opposite surface at an opposite side to the major surface of the substrate while rotating the substrate.

According to the present substrate processing method, the substrate can be heated by a simple method of supplying the heating fluid to the opposite surface. The heating fluid supplied to the opposite surface of the substrate in the rotating state spreads uniformly toward a peripheral edge portion at the lower surface of the substrate due to an action of centrifugal force. Since an entirety of the substrate can thus be heated uniformly, the solvent can be evaporated uniformly from the entire major surface of the substrate.

In a preferred embodiment of the present invention, the substrate processing method further includes a substrate rotation stopping step of stopping the rotation of the substrate for a predetermined time after the polymer film forming step. According to the present method, excessive evaporation of the solvent from the polymer film on the major surface of the substrate can be suppressed by stopping the rotation of the substrate. The metal foreign matter can thereby be adsorbed by the polymer film by action of the acidic polymer in the polymer film while suppressing the polymer film from solidifying completely.

In a preferred embodiment of the present invention, the substrate processing method further includes a preparation step of storing the polymer-containing liquid in a polymer-containing liquid tank. Also, the polymer-containing liquid supplying step includes a polymer-containing liquid discharging step in which the polymer-containing liquid is supplied from the polymer-containing liquid tank to a polymer-containing liquid nozzle and discharged toward the major surface of the substrate from the polymer-containing liquid nozzle.

According to the present substrate processing method, the polymer-containing liquid is stored in the polymer-containing liquid tank. The acidic polymer and the oxidizing agent can thus be mixed before supplying the acidic polymer and the oxidizing agent to the polymer-containing liquid nozzle. A ratio of the acidic polymer and the oxidizing agent in the polymer-containing liquid can thus be adjusted with high precision.

In a preferred embodiment of the present invention, the polymer-containing liquid further contains a conductive polymer that is dissolved in the solvent. Also, the polymer film formed in the polymer film forming step further contains the conductive polymer. Ionization of the acidic polymer in the polymer film and ionization of the metal foreign matter can thus be promoted by an action of the conductive film. The acidic polymer can thus be made to act effectively on the metal foreign matter.

Further, the conductive polymer functions, as does the solvent, as a medium for release of protons (hydrogen ions) by the acidic polymer. Thus, if the conductive polymer is contained in the polymer film, even when the solvent is eliminated completely from the polymer film and the polymer film is put in a solid state, the acidic polymer can be ionized and the ionized acidic polymer can be made to act on the metal foreign matter.

In a preferred embodiment of the present invention, the substrate processing method further includes a solidified cleaning film forming step of forming a solidified cleaning film of solid state or semisolid state on the major surface of the substrate before the polymer-containing liquid supplying step and a solidified cleaning film removing liquid supplying step of supplying, to the major surface of the substrate before the polymer-containing liquid supplying step, a solidified cleaning film removing liquid by which the solidified cleaning film is peeled off from the major surface of the substrate and removed from the major surface of the substrate.

According to this method, before the polymer-containing liquid supplying step, the solidified cleaning film formed on the major surface of the substrate is peeled off from the major surface of the substrate and removed from the major surface of the substrate by the solidified cleaning film removing liquid. The solidified cleaning film is of solid state or semisolid state and can therefore hold a particulate foreign matter such as a particle, etc., that is adhered to the major surface of the substrate. Since the solidified cleaning film is peeled off from the major surface of the substrate in a state of holding the particulate foreign matter, the particulate foreign matter can be removed together with the solidified cleaning film. By the particulate foreign matter being held by the solidified cleaning film, a kinetic energy that it receives from the solidified cleaning film removing liquid flowing on the major surface of the substrate increases more than a kinetic energy that a particulate foreign matter not held by the solidified cleaning film receives from the solidified cleaning film removing liquid. The particulate foreign matter can thus be removed effectively from the major surface of the substrate. The polymer-containing liquid can be supplied to the major surface of the substrate after the particulate foreign matter has been removed sufficiently by the solidified cleaning film.

Another preferred embodiment of the present invention provides a substrate processing apparatus including a spin chuck that holds a substrate and rotates the substrate around a predetermined rotational axis, a polymer-containing liquid nozzle that supplies, to a major surface of the substrate held by the spin chuck, a polymer-containing liquid being a polymer-containing liquid containing an acidic polymer and a solvent that dissolves the acidic polymer and forming a polymer film containing the acidic polymer on the major surface of the substrate, and a rinse liquid nozzle that supplies a rinse liquid to the major surface of the substrate held by the spin chuck.

According to the present substrate processing apparatus, the polymer film can be formed on the major surface of the substrate by supplying the polymer-containing liquid to the major surface of the substrate held by the spin chuck. Specifically, the polymer film can be formed by rotating the substrate with the polymer-containing liquid adhered thereto to evaporate the solvent. By an action of the acidic polymer in the polymer film, a metal foreign matter is pulled away from the major surface of the substrate and adsorbed by the polymer film. Thus, by supplying just the polymer-containing liquid of an amount necessary to cover an entirety of the major surface of the substrate, forming the polymer film by the polymer-containing liquid, and thereafter cleaning the major surface of the substrate by the rinse liquid to remove the polymer film, the metal foreign matter can be removed without continuously supplying the polymer-containing liquid to the major surface of the substrate.

Since the metal foreign matter can therefore be removed sufficiently without immersing the substrate in the polymer-containing liquid, a usage amount of the polymer-containing liquid can be reduced. An environmental burden can thereby be reduced.

Yet another preferred embodiment of the present invention provides a polymer-containing liquid containing an acidic polymer that removes a metal foreign matter adhered to a major surface of a substrate from the major surface of the substrate, an oxidizing agent that promotes the removal of the metal foreign matter by the acidic polymer, and a solvent that dissolves the oxidizing agent and the acidic polymer.

According to this configuration, the oxidizing agent and the acidic polymer are dissolved in the solvent. Thus, by making the polymer-containing liquid adhere to the major surface of the substrate and evaporating the solvent from the polymer-containing liquid, a film constituted mainly of the acidic polymer and the oxidizing agent, that is, a polymer film can be formed on the major surface of the substrate. By actions of the acidic polymer and the oxidizing agent in the polymer film, the metal foreign matter can be adsorbed by the polymer film. Thus, by forming the polymer film by the polymer-containing liquid of an amount necessary to cover an entirety of the major surface of the substrate and then removing the polymer film, the metal foreign matter can be removed from the major surface of the substrate without continuously supplying the polymer-containing liquid to the major surface of the substrate.

Since the metal foreign matter can therefore be removed sufficiently without immersing the substrate in the polymer-containing liquid, a usage amount of the polymer-containing liquid can be reduced.

The above and yet other objects, features, and effects of the present invention will become more apparent from the following description of the preferred embodiments made with reference to the attached drawings.

BRIEF DESCRIPTION OF DRAWINGS

FIG. 4 is a flowchart for describing an example of substrate processing executed by the substrate processing apparatus.

DESCRIPTION OF EMBODIMENTS

Figure 1:
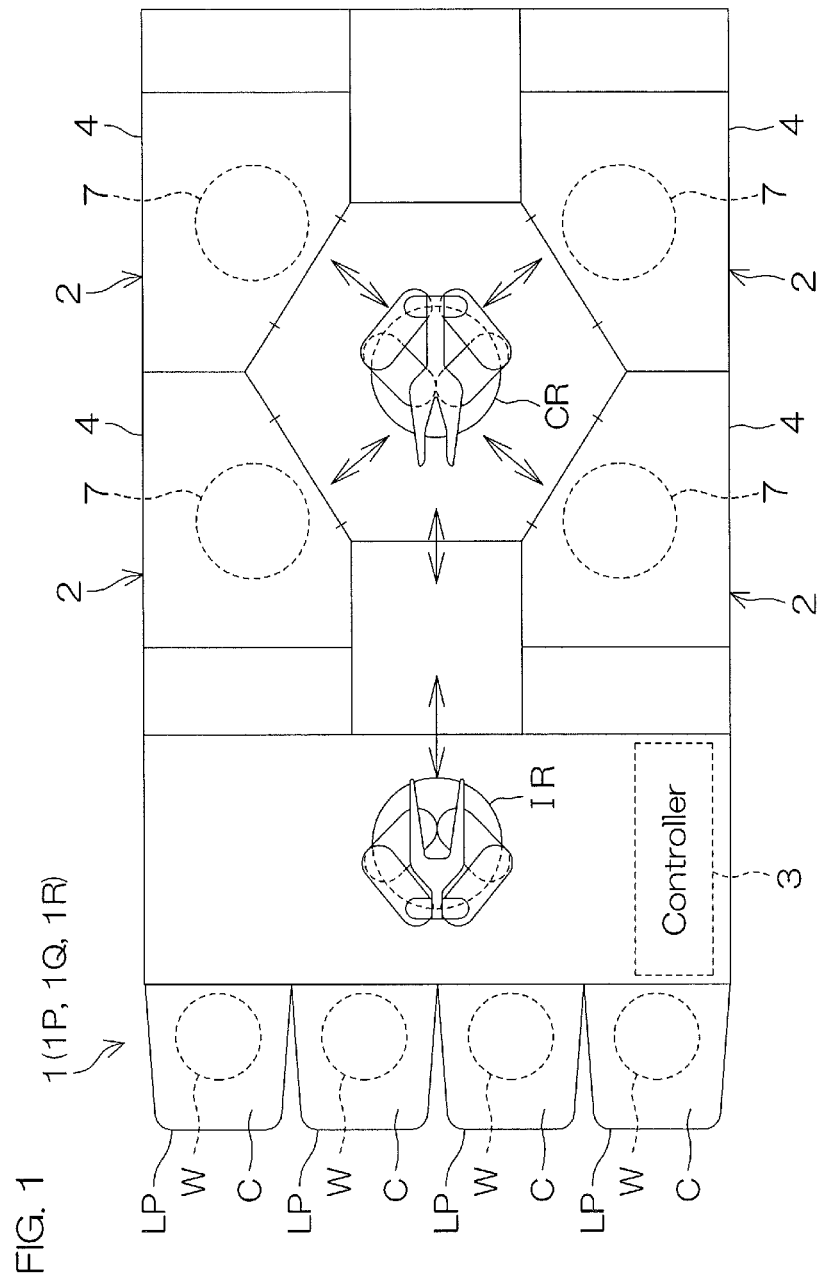
FIG. 1 is a plan view for describing an arrangement of a substrate processing apparatus according to a first preferred embodiment of the present invention.

Arrangement of Substrate Processing Apparatus According to First Preferred Embodiment FIG. 1 is a plan view for describing an arrangement of a substrate processing apparatus 1 according to a first preferred embodiment of the present invention.

The substrate processing apparatus 1 is a single substrate processing type apparatus that processes substrates W such as silicon wafers, etc., one by one. In the present preferred embodiment, each substrate W is a substrate of disk shape. The substrate W has a pair of major surfaces and is processed in an orientation in which either of the major surfaces is faced upward. At least one of the pair of major surfaces is a device surface on which a circuit pattern is formed. One of the pair of major surfaces may be a non-device surface on which a circuit pattern is not formed.

The substrate processing apparatus 1 includes a plurality of processing units 2 for processing substrates W with fluids, load ports LP on which are placed carriers C that house a plurality of the substrates W to be processed by the processing units 2, transfer robots IR and CR that transfer the substrates W between the load ports LP and the processing units 2, and a controller 3 that controls the substrate processing apparatus 1.

The transfer robot IR transfers the substrates W between the carriers C and the transfer robot CR. The transfer robot CR transfers the substrates W between the transfer robot IR and the processing units 2. The plurality of processing units 2 have, for example, the same arrangement. Although details shall be described below, fluids supplied toward a substrate W inside a processing unit 2 include a polymer-containing liquid, a liquid oxidizing agent, a rinse liquid, a heating fluid, etc.

Each processing unit 2 includes a chamber 4 and a processing cup 7 disposed inside the chamber 4 and executes processing of the substrate W inside the processing cup 7. An inlet/outlet (not shown) for carrying in the substrates W and carrying out the substrates W by the transfer robot CR is formed at the chamber 4. The chamber 4 is provided with a shutter unit (not shown) for opening/closing the inlet/outlet.

Figure 2:
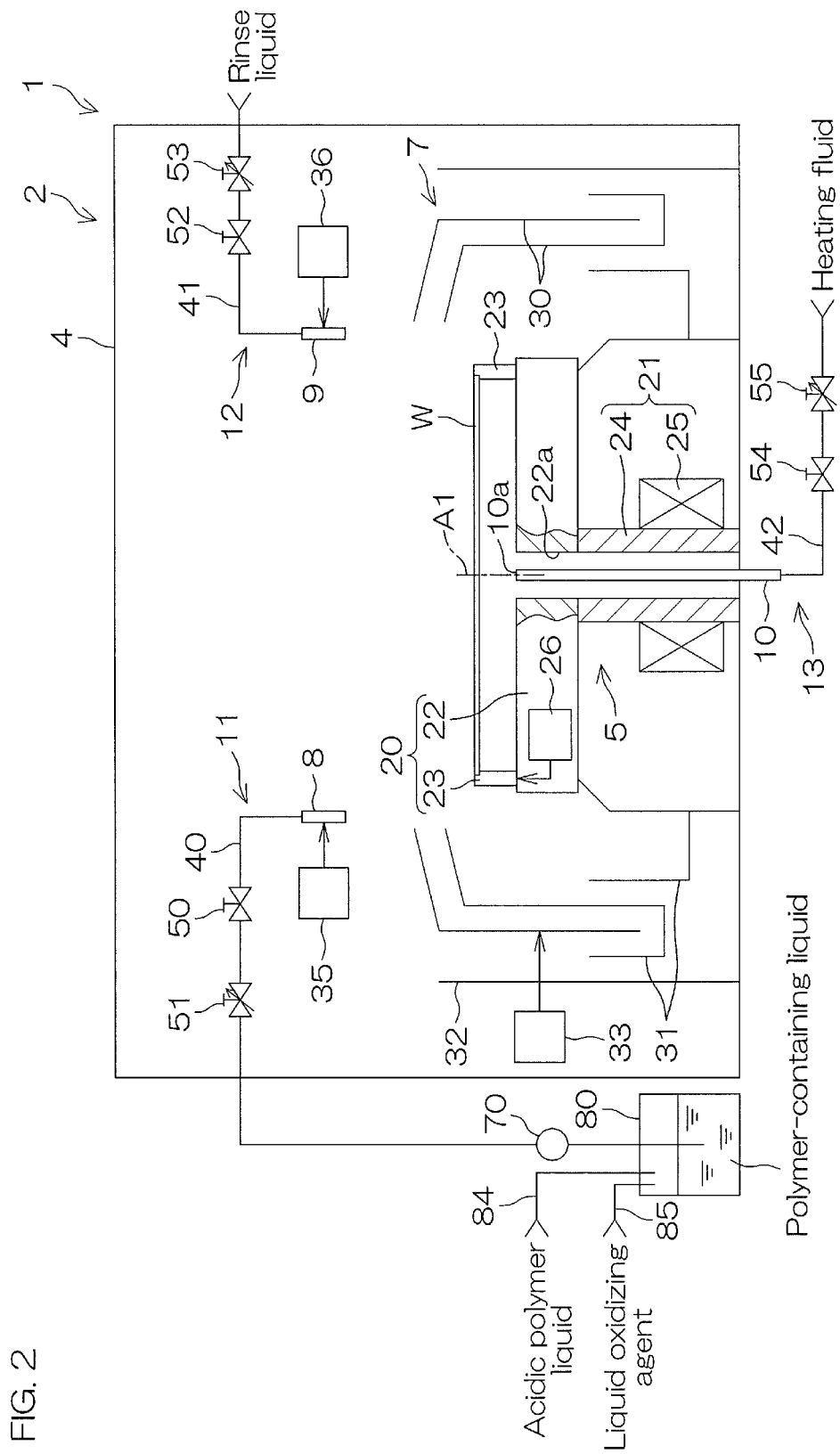
FIG. 2 is a schematic sectional view for describing an arrangement example of a processing unit included in the substrate processing apparatus.

FIG. 2 is a schematic sectional view for describing an arrangement example of the processing unit 2.

The processing unit 2 further includes a spin chuck 5 that rotates the substrate W around a rotational axis A1 (a vertical axis) while holding the substrate W horizontally. The rotational axis A1 is a vertical rectilinear line that passes through a central portion of the substrate W.

The spin chuck 5 includes a substrate holding unit 20 that holds the substrate W at a predetermined holding position and a substrate rotating unit 21 that rotates the substrate holding unit 20 around the rotational axis A1. The holding position is the position of the substrate W shown in FIG. 2 and is a position at which the substrate W is held in a horizontal orientation.

The substrate holding unit 20 includes a spin base 22 that has a disk shape oriented along a horizontal direction and a plurality of chuck pins 23 that grip the substrate W above the spin base 22 and hold the substrate W at the holding position. The plurality of chuck pins 23 are disposed on an upper surface of the spin base 22 at intervals in a circumferential direction of the spin base 22. The substrate holding unit 20 is also referred to as a substrate holder.

The substrate rotating unit 21 includes a rotating shaft 24 that has an upper end coupled to the spin base 22 and extends in a vertical direction and a spin motor 25 that rotates the rotating shaft 24 around its central axis (rotational axis A1). The spin motor 25 rotates the rotating shaft 24 to rotate the spin base 22 and the plurality of chuck pins 23 around the rotational axis A1. The substrate W is thereby rotated around the rotational axis A1 together with the spin base 22 and the plurality of chuck pins 23.

The plurality of chuck pins 23 are enabled to open and close between a closed state of gripping the substrate W by contacting a peripheral end of the substrate W and an open state of being retreated from the peripheral end of the substrate W. The plurality of chuck pins 23 are opened and closed by an opening/closing unit 26. In the closed state, the plurality of chuck pins 23 hold (clamp) the substrate W horizontally. In the open state, the plurality of chuck pins 23 release gripping of a peripheral edge portion of the substrate W while contacting a peripheral edge portion of a lower surface (major surface at a lower side) of the substrate W to support the substrate W from below.

The opening/closing unit 26 includes, for example, a link mechanism that is housed in an interior of the spin base 22 and a driving source that is disposed outside the spin base 22. The driving source includes an electric motor.

The spin chuck 5 is not restricted to be of a gripping type and may, for example, be a vacuum chuck of a vacuum suction type. The vacuum chuck vacuum-suctions the lower surface of the substrate W to hold the substrate W at a holding position in a horizontal orientation and further rotates the substrate W in that state around a vertical rotational axis.

The processing cup 7 receives liquid splashed from the substrate W held by the spin chuck 5. The processing cup 7 includes a plurality of guards 30 that receive liquid splashed outward from the substrate W held by the spin chuck 5, a plurality of cups 31 that receive liquid guided downward by the plurality of guards 30, and an outer wall member 32 of circular cylindrical shape that surrounds the plurality of guards 30 and the plurality of cups 31. With the present preferred embodiment, an example provided with two guards 30 and two cups 31 is illustrated.

The respective guards 30 each have a substantially circular cylindrical shape. Upper end portions of the respective guards 30 are inclined inward such as to be directed toward the spin base 22. The plurality of cups 31 are respectively disposed below the plurality of guards 30. The cups 31 form annular liquid receiving grooves that receive the liquid guided downward by the guards 30.

The processing unit 2 includes a guard elevating/lowering unit 33 that elevates and lowers the plurality of guards 30 individually. The guard elevating/lowering unit 33 positions each guard 30 at any position from an upper position to a lower position. FIG. 2 shows a state where the two guards 30 are both disposed at the upper positions. The upper positions are positions at which upper ends of the guards 30 are disposed higher than the holding position at which the substrate W held by the spin chuck 5 is disposed. The lower positions are positions at which the upper ends of the guards 30 are disposed lower than the holding position.

The guard elevating/lowering unit 33 includes, for example, a plurality of ball-screw mechanisms (not shown) respectively coupled to the plurality of guards 30 and a plurality of motors (not shown) that apply driving forces to the respective ball screw mechanisms. The guard elevating/lowering unit 33 is also referred to as a guard lifter.

When a liquid is supplied to the substrate W that is rotating, at least one of the guards 30 is disposed at the upper position. When the liquid is supplied to the substrate W in this state, the liquid is spun off outward from the substrate W. The liquid that has been spun off collides with an inner surface of a guard 30 that faces the substrate W horizontally and is guided to the cup 31 corresponding to this guard 30. When the transfer robot CR (see FIG. 1) accesses the spin chuck 5 in carry-in and carry-out of the substrate W, all of the guards 30 are positioned at the lower positions.

The processing unit 2 further includes a polymer-containing liquid nozzle 8 that discharges the polymer-containing liquid toward an upper surface (major surface at an upper side) of the substrate W held by the spin chuck 5 and a rinse liquid nozzle 9 that discharges the rinse liquid such as DIW, etc., toward the upper surface of the substrate W held by the spin chuck 5.

The polymer-containing liquid contains a component (an acidic polymer to be described below) that forms a film (polymer film) of solid state or semisolid state. The semisolid state is a state in which a solid component and a liquid component are mixed. The solid state is a state that is constituted of just the solid component and in which the liquid component is not contained. The polymer film with which a solvent is remaining is in the semisolid state and the polymer film with which the solvent is completely eliminated is in the solid state.

The polymer-containing liquid contains a solute and the solvent such as DIW, etc., that dissolves the solute. The solute contains an oxidizing agent such as hydrogen peroxide, etc., and the acidic polymer such as a polyacrylic acid, etc.

A molecular weight of the acidic polymer is, for example, not less than 1000 and not more than 100000. The acidic polymer has a function of adsorbing a metal foreign matter adhered to the major surface of the substrate W. In a water-based solvent such as DIW, etc., the acidic polymer releases protons (hydrogen ions) and is negatively charged. The acidic polymer thus severs bonding of the metal foreign matter and the major surface of the substrate to ionize the metal foreign matter, adorbs the ionized metal foreign matter (positive ions) to pull it away from the major surface of the substrate W.

As the metal foreign matter that can adhere to the major surface of the substrate W, for example, aluminum (Al), potassium (K), titanium (Ti), chromium (Cr), iron (Fe), nickel (Ni), copper (Cu), calcium (Ca), manganese (Mn), cobalt (Co), zinc (Zn), hafnium (Hf), tantalum (Ta), etc., can be cited.

The acidic polymer is not restricted to a polyacrylic acid. A pH of the polymer-containing liquid suffices to be less than 7 and is preferably not more than 5. The acidic polymer is, for example, a carboxy-group-containing polymer, a sulfo-group-containing polymer, or a mixture of these. The carboxylic acid polymer is, for example, a polyacrylic acid, a carboxyvinyl polymer (carbomer), a carboxymethylcellulose, or a mixture of these. The sulfo-group-containing polymer is, for example, a polystyrene sulfonic acid, a polyvinyl sulfonic acid, or a mixture of these.

The oxidizing agent has a function of promoting the adsorption of the metal foreign matter by the acidic polymer. The oxidizing agent is a substance of higher redox potential than the metal foreign matter. The oxidizing agent thus takes electrons from the metal foreign matter adhered to the major surface of the substrate W and promotes ionization of the metal foreign matter. The oxidizing agent contains, for example, at least one among hydrogen peroxide and ozone.

The redox potential described below is a redox potential measured using a normal hydrogen electrode (NHE) as a reference. The redox potential of hydrogen peroxide is 1.776 V and the redox potential of ozone is 2.067 V. On the other hand, the redox potentials of copper, nickel, iron, and aluminum are 0.337 V, −0.250 V, −0.440 V, and −1.663 V, respectively. Thus, when an oxidizing agent that contains at least one among hydrogen peroxide and ozone is used as the oxidizing agent, electrons can be taken from the metal foreign matter and the ionization of the metal foreign matter can be promoted.

The solvent suffices to be a substance that is a liquid at ordinary temperature (for example, a temperature of not less than 5° C. and not more than 25° C.; also referred to as room temperature), is capable of dissolving the acidic polymer and the oxidizing agent, and is evaporated (volatilized) by rotation or heating of the substrate W. The solvent is not restricted to DIW. The solvent is a component that contains at least one among DIW, carbonated water, electrolyzed ion water, aqueous hydrochloric acid solution of dilute concentration (for example of not less than 1 ppm and not more than 100 ppm), ammonia water of dilute concentration (for example of not less than 1 ppm and not more than 100 ppm), and reduced water (hydrogen water).

The polymer-containing liquid is preferably a liquid in which the liquid oxidizing agent and an acidic polymer liquid are mixed at a volume ratio of 1:6. The liquid oxidizing agent is a liquid that contains the solvent and the oxidizing agent described above and a percent by mass concentration of the oxidizing agent in the liquid oxidizing agent is, for example, 30% by mass (wt %). The acidic polymer liquid is a liquid that contains the solvent and the acidic polymer described above and a percent by mass concentration of the acidic polymer in the acidic polymer liquid is, for example, 10% by mass (wt %).

The rinse liquid is a liquid that cleans the major surface of the substrate W by removing the polymer film formed on the major surface of the substrate W. The rinse liquid removes the polymer film from the major surface of the substrate W by dissolving the polymer film. The rinse liquid is thus also referred to as a polymer film removing liquid.

The rinse liquid is not restricted to DIW. The rinse liquid is a component that contains at least one among DIW, carbonated water, electrolyzed ion water, aqueous hydrochloric acid solution of dilute concentration (for example of not less than 1 ppm and not more than 100 ppm), ammonia water of dilute concentration (for example of not less than 1 ppm and not more than 100 ppm), and reduced water (hydrogen water). That is, the same liquid as the solvent of the polymer-containing liquid can be used as the rinse liquid. By using the same type of liquid (for example, DIW) as both the rinse liquid and the solvent of the polymer-containing liquid, the types of liquids (substances) used can be lessened.

In the present preferred embodiment, the polymer-containing liquid nozzle 8 is a scan nozzle that is movable in a horizontal direction. The polymer-containing liquid nozzle 8 is moved in the horizontal direction by a first nozzle moving unit 35. The polymer-containing liquid nozzle 8 can move between a central position and a home position (retreat position) in the horizontal direction. When positioned at the central position, the polymer-containing liquid nozzle 8 faces a central region of the upper surface of the substrate W. The central region of the upper surface of the substrate W is a region of the upper surface of the substrate W that includes a rotation center of the substrate W. When positioned at the home position, the polymer-containing liquid nozzle 8 does not face the upper surface of the substrate W and is positioned outside the processing cup 7 in plan view.

The first nozzle moving unit 35 includes an arm (not shown) that is coupled to the polymer-containing liquid nozzle 8 and extends horizontally and an arm moving unit (not shown) that moves the arm in the horizontal direction. The arm moving unit may include, for example, a pivoting shaft (not shown) that is coupled to the arm and extends in the vertical direction and a motor or other pivoting actuator (not shown) that pivots the pivoting shaft. The polymer-containing liquid nozzle 8 may also be movable in the vertical direction. By moving in the vertical direction, the polymer-containing liquid nozzle 8 can approach the upper surface of the substrate W and retreat upward from the upper surface of the substrate W.

The polymer-containing liquid nozzle 8 is connected to one end of a polymer-containing liquid piping 40 that guides the polymer-containing liquid to the polymer-containing liquid nozzle 8. Another end of the polymer-containing liquid piping 40 is connected to a polymer-containing liquid tank 80 that stores the polymer-containing liquid. A polymer-containing liquid valve 50 that opens and closes a flow passage inside the polymer-containing liquid piping 40 and a polymer-containing liquid flow control valve 51 that adjusts a flow rate of the polymer-containing liquid inside the flow passage are interposed in the polymer-containing liquid piping 40.

The polymer-containing liquid is replenished into the polymer-containing liquid tank 80 and the polymer-containing liquid is stored in the polymer-containing liquid tank 80 (preparation step). For example, the liquid oxidizing agent and the acidic polymer liquid are replenished into the polymer-containing liquid tank 80 via separate replenishing pipes 84 and 85. The polymer-containing liquid may, unlike in the example shown in FIG. 2, be replenished into the polymer-containing liquid tank 80 via a polymer-containing liquid replenishing pipe (not shown).

A pump 70 is interposed in the polymer-containing liquid piping 40. Thus, when the polymer-containing liquid valve 50 is opened, the polymer-containing liquid inside the polymer-containing liquid tank 80 is fed to the polymer-containing liquid piping 40 by the pump 70. The polymer-containing liquid fed to the polymer-containing liquid piping 40 is discharged downward in a continuous flow from a discharge port of the polymer-containing liquid nozzle 8 at a flow rate in accordance with an opening degree of the polymer-containing liquid flow control valve 51. When the polymer-containing liquid valve 50 is opened when the polymer-containing liquid nozzle 8 is positioned at the central position, the polymer-containing liquid is supplied to the central region of the upper surface of the substrate W.

The polymer-containing liquid nozzle 8, the polymer-containing liquid piping 40, the polymer-containing liquid valve 50, the polymer-containing liquid flow control valve 51, and the pump 70 thus constitute a polymer-containing liquid supplying unit 11 that supplies the polymer-containing liquid to the major surface (upper surface) of the substrate W.

In the present preferred embodiment, the rinse liquid nozzle 9 is a scan nozzle that is movable in a horizontal direction. The rinse liquid nozzle 9 is moved in the horizontal direction by a second nozzle moving unit 36. The rinse liquid nozzle 9 can move between a central position and a home position (retreat position) in the horizontal direction. When positioned at the central position, the rinse liquid nozzle 9 faces the central region of the upper surface of the substrate W. When positioned at the home position, the rinse liquid nozzle 9 does not face the upper surface of the substrate W and is positioned outside the processing cup 7 in plan view.

The rinse liquid nozzle 9 is connected to a rinse liquid piping 41 that guides the rinse liquid to the rinse liquid nozzle 9. A rinse liquid valve 52 that opens and closes a flow passage inside the rinse liquid piping 41 and a rinse liquid flow control valve 53 that adjusts a flow rate of the rinse liquid inside the flow passage are interposed in the rinse liquid piping 41. When the rinse liquid valve 52 is opened, the rinse liquid is discharged downward in a continuous flow from a discharge port of the rinse liquid nozzle 9 at a flow rate in accordance with an opening degree of the rinse liquid flow control valve 53. When the rinse liquid valve 52 is opened when the rinse liquid nozzle 9 is positioned at the central position, the rinse liquid is supplied to the central region of the upper surface of the substrate W.

The rinse liquid nozzle 9, the rinse liquid piping 41, the rinse liquid valve 52, and the rinse liquid flow control valve 53 thus constitute a rinse liquid supplying unit 12 that supplies the rinse liquid to the upper surface of the substrate W.

The polymer-containing liquid nozzle 8 and the rinse liquid nozzle 9 may, unlike in the present preferred embodiment, be fixed nozzles that are fixed in horizontal position and vertical position.

The processing unit 2 further includes a heating fluid nozzle 10 that discharges a heating fluid toward the lower surface (major surface at the lower side; opposite surface) of the substrate W held by the spin chuck 5.

The heating fluid nozzle 10 is inserted in a penetrating hole 22a opening at an upper surface central portion of the spin base 22. A discharge port 10a of the heating fluid nozzle 10 is exposed from the upper surface of the spin base 22. The discharge port 10a of the heating fluid nozzle 10 faces a central region of the lower surface of the substrate W from below. The central region of the lower surface of the substrate W is a region of the lower surface of the substrate W that includes the rotation center of the substrate W.

A heating fluid piping 42 that guides the heating fluid to the heating fluid nozzle 10 is connected to the heating fluid nozzle 10. A heating fluid valve 54 that opens and closes a flow passage inside the heating fluid piping 42 and a heating fluid flow control valve 55 that adjusts a flow rate of the heating fluid inside the heating fluid piping 42 are interposed in the heating fluid piping 42.

When the heating fluid valve 54 is opened, the heating fluid is discharged upward in a continuous flow from the discharge port 10a of the heating fluid nozzle 10 and supplied to the central region of the lower surface of the substrate W. By the heating fluid being supplied to the lower surface of the substrate W, the polymer-containing liquid on the upper surface of the substrate W is heated via the substrate W.

The heating fluid nozzle 10, the heating fluid piping 42, the heating fluid valve 54, and the heating fluid flow control valve 55 thus constitute a heating fluid supplying unit 13 that supplies the heating fluid to the lower surface of the substrate W.

The heating fluid discharged from the heating fluid nozzle 10 is, for example, high temperature DIW of a temperature higher than room temperature and lower than a boiling point of the solvent contained in the polymer-containing liquid. If the solvent contained in the polymer-containing liquid is DIW, then, for example, DIW of not less than 60° C. and less than 100° C. is used as the heating fluid. The heating fluid discharged from the heating fluid nozzle 10 is not restricted to high temperature DIW and may be a high temperature gas such as a high temperature inert gas (high temperature nitrogen gas, etc.) or high temperature air, etc., of a temperature higher than room temperature and lower than the boiling point of the solvent contained in the polymer-containing liquid. Also, the heating fluid may be of a temperature not less than the boiling point of the solvent contained in the polymer-containing liquid.

Figure 3:
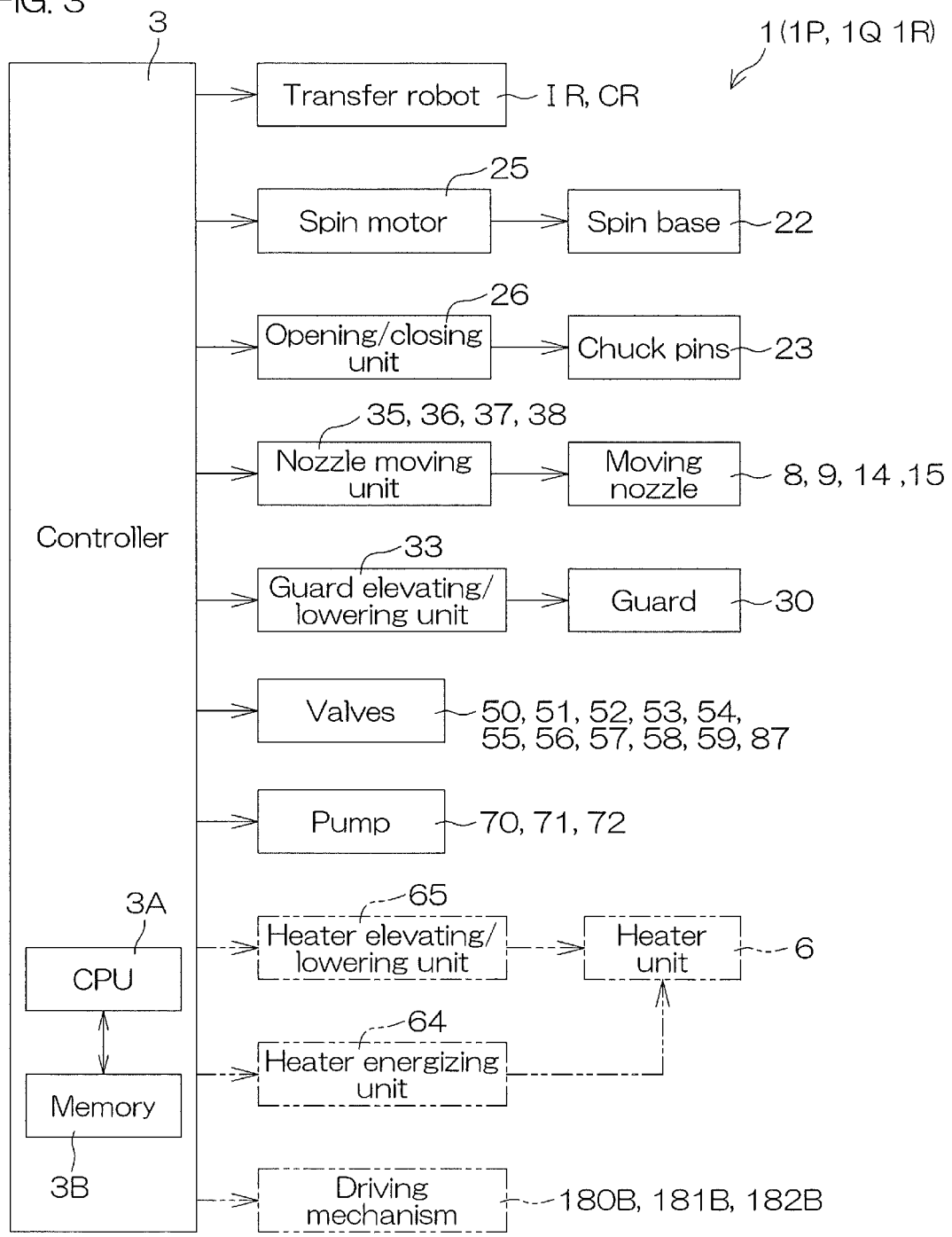
FIG. 3 is a block diagram for describing an arrangement example related to control of the substrate processing apparatus.

FIG. 3 is a block diagram for describing an arrangement example related to control of the substrate processing apparatus 1. The controller 3 includes a microcomputer and, in accordance with a predetermined control program, controls control objects included in the substrate processing apparatus 1.

Specifically, the controller 3 includes a processor (CPU) 3A and a memory 3B in which the control program is stored. The controller 3 is arranged to execute various controls for substrate processing by the processor 3A executing the control program.

In particular, the controller 3 is programmed to control the transfer robots IR and CR, the spin motor 25, the opening/closing unit 26, the first nozzle moving unit 35, the second nozzle moving unit 36, the guard elevating/lowering unit 33, the polymer-containing liquid valve 50, polymer-containing liquid flow control valve 51, the rinse liquid valve 52, the rinse liquid flow control valve 53, the heating fluid valve 54, the heating fluid flow control valve 55, and the pump 70. By the valves being controlled by the controller 3, discharge/non-discharge of fluids from the corresponding nozzles and discharge flow rates of fluids from the corresponding nozzles are controlled.

Also, although representative members are illustrated in FIG. 3, this does not mean that unillustrated members are not controlled by the controller 3 and the controller 3 can appropriately control respective members included in the substrate processing apparatus 1. Members described with modification examples and preferred embodiments described below are also indicated together in FIG. 3 and these members are also controlled by the controller 3.

Respective steps described below are executed by the controller 3 controlling the above arrangements. In other words, the controller 3 is programmed to execute the respective steps described below.

Example of Substrate Processing According to First Preferred Embodiment

FIG. 4 is a flowchart for describing an example of substrate processing executed by the substrate processing apparatus 1. Processing realized by the controller 3 executing the program is mainly shown in FIG. 4. FIG. 5A to FIG. 5E are schematic views for describing conditions of the respective steps of substrate processing executed by the substrate processing apparatus 1.

In the substrate processing by the substrate processing apparatus 1, for example, as shown in FIG. 4, a substrate carry-in step (step S1), a polymer-containing liquid supplying step (step S2), a polymer film forming step (step S3), a polymer film heating step (step S4), a rinsing step (step S5), a spin drying step (step S6), and a substrate carry-out step (step S7) are executed in that order.

In the following, the substrate processing executed by the substrate processing apparatus 1 shall be described mainly with reference to FIG. 2 and FIG. 4. FIG. 5A to FIG. 5E shall be referenced where appropriate.

First, an unprocessed substrate W is carried from a carrier C into a processing unit 2 by the transfer robots IR and CR (see FIG. 1) and transferred to the substrate holding unit 20 of the spin chuck 5 (substrate carry-in step: step S1). The substrate W is thereby held horizontally by the substrate holding unit 20 (substrate holding step).

The holding of the substrate W by the substrate holding unit 20 is continued until the spin drying step (step S6) ends. From when the substrate holding step is started until the spin drying step (step S6) is ended, the guard elevating/lowering unit 33 adjusts height positions of the plurality of guards 30 such that at least one of the guards 30 is positioned at the upper position.

Next, after the transfer robot CR has retreated outside the processing unit 2, the polymer-containing liquid supplying step (step S2) of supplying the polymer-containing liquid to the upper surface of the substrate W is executed. Specifically, the first nozzle moving unit 35 moves the polymer-containing liquid nozzle 8 to a processing position. The processing position of the polymer-containing liquid nozzle 8 is, for example, the central position.

Figure 5A:
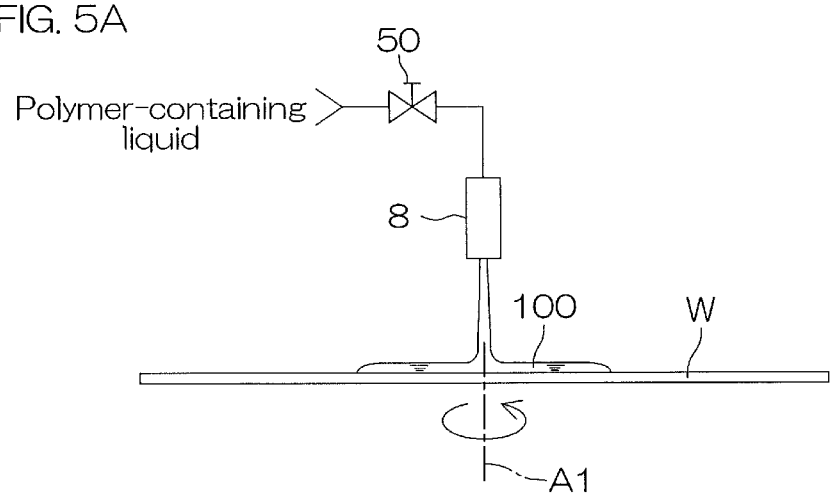
FIG. 5A is a schematic view for describing a condition of a substrate when the example of substrate processing is being performed.

The polymer-containing liquid valve 50 is opened in a state where the polymer-containing liquid nozzle 8 is positioned at the processing position. Thereby, the polymer-containing liquid is supplied (discharged) from the polymer-containing liquid nozzle 8 toward the central region of the upper surface of the substrate W as shown in FIG. 5A (polymer-containing liquid supplying step, polymer-containing liquid discharging step). The polymer-containing liquid discharged from the polymer-containing liquid nozzle 8 lands on the central region of the upper surface of the substrate W.

While the polymer-containing liquid is being supplied to the upper surface of the substrate W, the substrate W is rotated at a low speed (of, for example, 10 rpm) (substrate rotating step, low speed rotating step). Or, rotation of the substrate W is stopped while the polymer-containing liquid is being supplied to the upper surface of the substrate W. The polymer-containing liquid supplied to the substrate W thus stays at the central region of the upper surface of the substrate W and forms a polymer-containing liquid core 100. The supply of the polymer-containing liquid from the polymer-containing liquid nozzle 8 is continued for a predetermined time, for example, of 2 seconds to 4 seconds. An amount of the polymer-containing liquid supplied to the upper surface of the substrate W is approximately 2 cc.

Figure 5B:
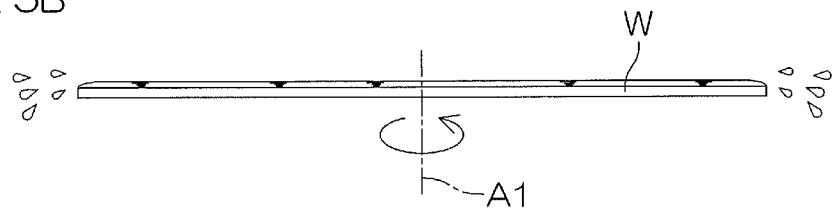
FIG. 5B is a schematic view for describing a condition of the substrate when the example of substrate processing is being performed.
Figure 5C:
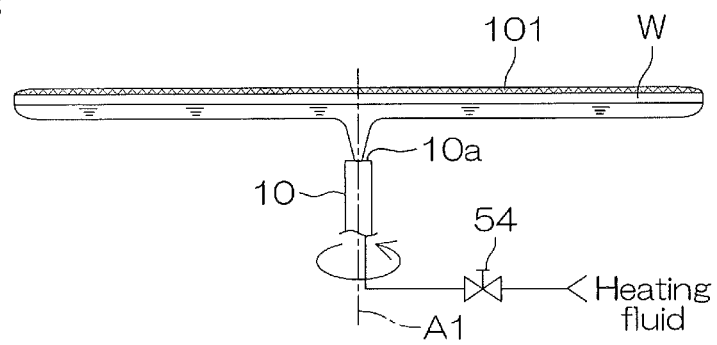
FIG. 5C is a schematic view for describing a condition of the substrate when the example of substrate processing is being performed.

Next, as shown in FIG. 5B and FIG. 5C, the substrate W with the polymer-containing liquid adhered to the upper surface is rotated to execute the polymer film forming step (step S3) of forming a polymer film 101 (see FIG. 5C) on the upper surface of the substrate W.

Specifically, the polymer-containing liquid valve 50 is closed and thereafter, the rotation of the substrate W is accelerated such that a rotational speed of the substrate W becomes a predetermined spin-off speed as shown in FIG. 5B (rotation accelerating step). The spin-off speed is, for example, 1500 rpm. After the polymer-containing liquid valve 50 is closed, the polymer-containing liquid nozzle 8 is moved to the home position by the first nozzle moving unit 35.

By a centrifugal force due to the rotation of the substrate W, the polymer-containing liquid that constitutes the polymer-containing liquid core 100 spreads toward a peripheral edge portion of the upper surface of the substrate W and becomes spreadingly coated on an entirety of the upper surface of the substrate W (coating step). A portion of the polymer-containing liquid on the substrate W splashes outside the substrate W from the peripheral edge portion of the substrate W and a liquid film (polymer-containing liquid core 100) of the polymer-containing liquid on the substrate W is thinned (spin-off step). In the coating step, the polymer-containing liquid does not have to splash outside the substrate W and it suffices that the entirety of the upper surface of the substrate W is covered by the polymer-containing liquid.

The centrifugal force due to the rotation of the substrate W acts not just on the polymer-containing liquid on the substrate W but also on a gas in contact with the polymer-containing liquid on the substrate W. Therefore, by the action of the centrifugal force, the gas forms a gas stream directed toward a peripheral edge side from a center side of the upper surface of the substrate W. By the gas stream, a solvent in a gas state in contact with the polymer-containing liquid on the substrate W is eliminated from an atmosphere in contact with the substrate W. Evaporation (volatilization) of the solvent from the polymer-containing liquid on the substrate W is thus promoted. By a portion of the solvent in the polymer-containing liquid evaporating, the polymer film 101 is formed (polymer film forming step). The substrate rotating unit 21 is an example of a polymer film forming unit that rotates the substrate W held by the substrate holding unit 20 to form the polymer film 101 from the polymer-containing liquid adhered to the upper surface (major surface) of the substrate W. The polymer film 101 is high in viscosity in comparison to the polymer-containing liquid because it is lower in content of the solvent than the polymer-containing liquid. Thus, despite the substrate W rotating, the polymer film 101 remains on the substrate W without being completely eliminated from being on the substrate W. The rotation of the substrate W at the spin-off speed is continued, for example, for 30 seconds.

By an action of the acidic polymer in the polymer film 101 formed on the substrate W, the metal foreign matter is pulled away from the upper surface of the substrate W and adsorbed by the polymer film 101 (metal foreign matter adsorbing step). The adsorption of the metal foreign matter by the acidic polymer is promoted by an action of the oxidizing agent in the polymer film 101 of semisolid state (adsorption promoting step).

Next, the polymer film heating step (step S4) of heating the polymer film 101 on the substrate W is executed. Specifically, the heating fluid valve 54 is opened. The heating fluid is thereby supplied to the lower surface (opposite surface) of the substrate W and the substrate W is heated by the heating fluid as shown in FIG. 5C (substrate heating step, fluid heating step). The heating fluid supplied to the lower surface of the substrate W heats the polymer film 101 via the substrate W (polymer film heating step). While the heating fluid is being supplied to the lower surface of the substrate W, the substrate W is rotated at a predetermined fluid heating speed. The fluid heating speed is, for example, 800 rpm.

The solvent in the polymer film 101 is evaporated by the heating and a concentration of the acidic polymer in the polymer film 101 increases (polymer concentrating step). The adsorption of the metal foreign matter to the polymer film 101 due to the action of the acidic polymer is thereby promoted. The acidic polymer of high concentration can thus be made to act on the metal foreign matter. The metal foreign matter can therefore be adsorbed effectively from the major surface of the substrate W.

In a method where, unlike in the first preferred embodiment, a liquid containing a volatile substance as an acidic component, for example, a mixed liquid of hydrochloric acid and hydrogen peroxide water (HPM liquid, etc.) is supplied continuously in a continuous flow to the upper surface of the substrate W to remove a metal foreign matter from the substrate W, hydrogen chloride (acidic component) that is the volatile substance volatilizes in accompaniment with evaporation of the solvent in the liquid. Thus, it may not be possible to form a film of semisolid state or solid state or to increase a concentration of the acidic component by the evaporation of the solvent.

The temperature of the heating fluid used in heating the substrate W is a temperature less than the boiling point of the solvent. The solvent can thus be evaporated suitably from the polymer film 101 on the substrate W. Thus, while increasing the concentration of the acidic polymer dissolved in the solvent in the polymer film 101, the solvent can be suppressed from evaporating fully and being removed completely from inside the polymer film 101.

In the present preferred embodiment, the substrate W is heated by a simple method of supplying the heating fluid to the lower surface (opposite surface) of the substrate W. The heating fluid supplied to the lower surface of the substrate W in the rotating state spreads uniformly toward the peripheral edge portion at the lower surface of the substrate W due to the action of the centrifugal force. Since an entirety of the substrate W can thus be heated uniformly, the solvent can be evaporated uniformly from the entire upper surface of the substrate W.

Figure 5D:
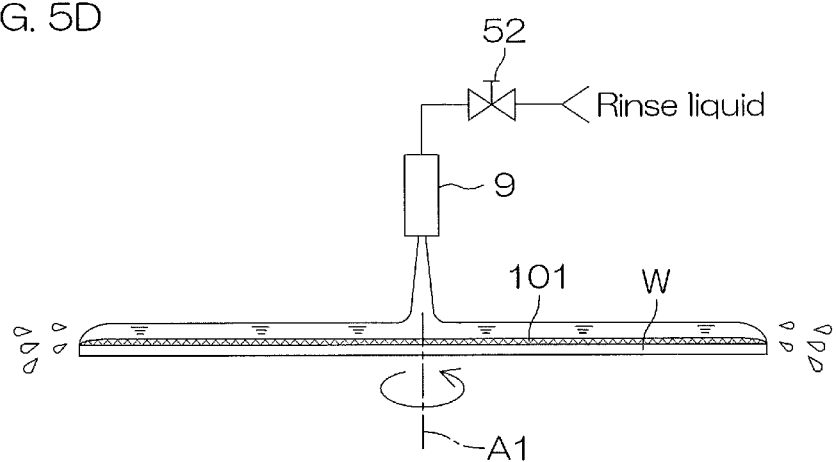
FIG. 5D is a schematic view for describing a condition of the substrate when the example of substrate processing is being performed.

Next, the rinsing step (step S5) of cleaning the upper surface of the substrate W with the rinse liquid to remove the polymer film 101 on the substrate W is executed. Specifically, the second nozzle moving unit 36 moves the rinse liquid nozzle 9 to a processing position. The processing position of the rinse liquid nozzle 9 is, for example, the central position. The rinse liquid valve 52 is opened in a state where the rinse liquid nozzle 9 is positioned at the processing position. Thereby, the rinse liquid is supplied (discharged) from the rinse liquid nozzle 9 toward the central region of the upper surface of the substrate W with the polymer film 101 formed thereon as shown in FIG. 5D (rinse liquid supplying step, rinse liquid discharging step). Before the supply of the rinse liquid to the substrate W is started, the heating fluid valve 54 is closed and the discharge of the heating fluid from the heating fluid nozzle 10 is stopped.

Figure 5E:
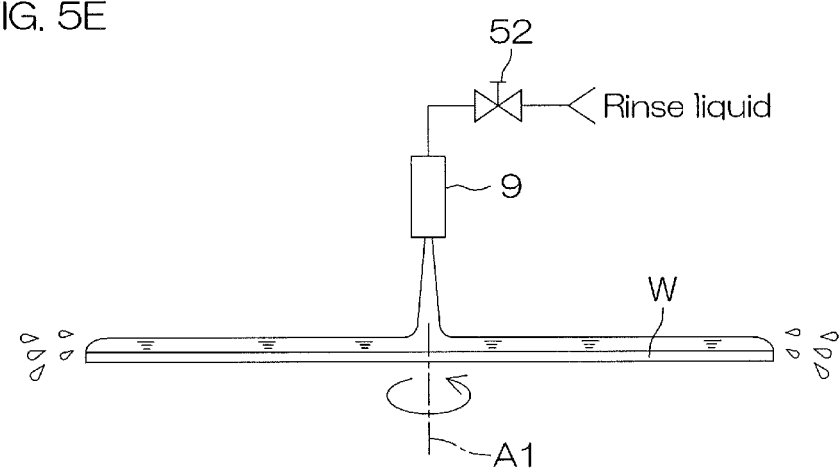
FIG. 5E is a schematic view for describing a condition of the substrate when the example of substrate processing is being performed.

The polymer film 101 on the substrate W is dissolved by the rinse liquid supplied to the substrate W (polymer film dissolving step). By continuing to supply the rinse liquid to the substrate W, the polymer film 101 is removed from the upper surface of the substrate W as shown in FIG. 5E (polymer film removing step). The polymer film 101 is removed from the upper surface of the substrate W by a dissolving action of the rinse liquid and by a flow of the rinse liquid that is formed by the continuous supply of the rinse liquid and the rotation of the substrate W. The rinse liquid supplying unit 12 and the substrate rotating unit 21 thus function as a polymer film removing unit that supplies the rinse liquid to the upper surface (major surface) of the substrate W to remove the polymer film 101 from the upper surface of the substrate W.

Next, the spin drying step (step S6) of drying the upper surface of the substrate W by rotating the substrate W at high speed is executed. Specifically, the rinse liquid valve 52 is closed. The supply of the rinse liquid to the upper surface of the substrate W is thereby stopped.

The spin motor 25 then accelerates the rotation of the substrate W and rotates the substrate W at high speed. The substrate W is rotated at a drying speed of, for example, 1500 rpm. Thereby, a large centrifugal force acts on the rinse liquid on the substrate W and the rinse liquid on the substrate W is spun off to a periphery of the substrate W.

The spin motor 25 then stops the rotation of the substrate W. The guard elevating/lowering unit 33 moves the plurality of guards 30 to the lower positions.

The transfer robot CR enters into the processing unit 2, lifts up the processed substrate W from the chuck pins 23 of the substrate holding unit 20, and carries it outside the processing unit 2 (substrate carry-out step (step S7)). The substrate W is transferred from the transfer robot CR to the transfer robot IR and housed in a carrier C by the transfer robot IR.

<Condition of Removal of Metal Foreign Matters>

Figure 6A:
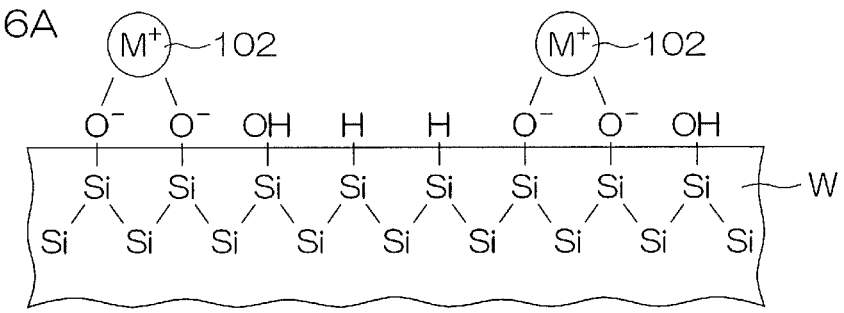
FIG. 6A is a schematic view for describing a condition of removal of metal foreign matters adhered to a major surface of the substrate.
Figure 6B:
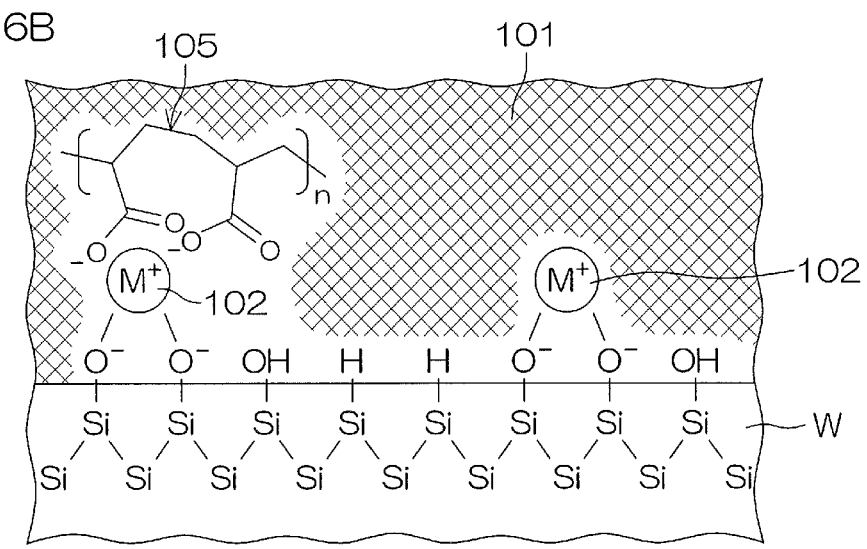
FIG. 6B is a schematic view for describing a condition of removal of the metal foreign matters adhered to the major surface of the substrate.

Next, a condition of removal of metal foreign matters from the major surface of the substrate W (the upper surface of the substrate W in the substrate processing described above) shall be described. FIG. 6A to FIG. 6B are schematic views for describing the condition of removal of metal foreign matters 102 adhered to the major surface of the substrate W.

FIG. 6A is a schematic view showing a condition of the major surface of the substrate W in a state before the polymer-containing liquid is supplied. Before the polymer-containing liquid is supplied, the metal foreign matters 102 are adhered to the major surface of the substrate W. In detail, the metal foreign matters 102 are bonded to the major surface of the substrate W. In more detail, the metal foreign matters 102 are bonded to a substance constituting a surface of the major surface of the substrate W. The surface layer portion of the major surface of the substrate W is constituted, for example, of an insulator layer such as a silicon oxide layer ($SiO_2$ layer), a silicon nitride layer (SiN layer), etc., or a semiconductor layer such as a silicon layer, etc.

FIG. 6B shows a state where the polymer film 101 is formed on the major surface of the substrate W.

As shown in FIG. 6B, in the state where the polymer film 101 is formed, bonds between oxygen atoms of hydroxy groups (OH) exposed from the major surface of the substrate W and metal foreign matters 102 are severed by an acidic polymer 105 in the polymer film 101. The metal foreign matters 102 are thereby ionized. The ionized metal foreign matters 102 become adsorbed by the acidic polymer 105. FIG. 6B shows an example where the acidic polymer 105 is a polyacrylic acid.

In detail, the acidic polymer 105 releases protons into the solvent and is negatively charged. The acidic polymer 105 thus adsorbs (draws) the ionized metal foreign matters 102 (metal ion) by a Coulombic force and pulls away the ionized metal foreign matters 102 from the substrate W (ion adsorbing step, metal foreign matter adsorbing step). The metal foreign matters 102 are thereby adsorbed by the polymer film 101 (metal foreign matter adsorbing step). Since the solvent remains in the polymer film, the solvent functions as a medium for donating and accepting of ions (protons) by the acidic polymer in the polymer film.

The ionization of the metal foreign matters 102 is promoted by the oxidizing agent (ionization promoting step). Specifically, by an action of the oxidizing agent, the metal foreign matters 102 are deprived of electrons ($e^-$) and become metal ions (positive ions). Since the ionization of the metal foreign matters 102 is promoted by the oxidizing agent, the adsorption of the ionized metal foreign matters 102 by the acidic polymer 105 is promoted (adsorption promoting step).

The metal foreign matters 102 are thus ionized by the acidic polymer 105 in the polymer film 101 and adsorbed by the polymer film 101. Further, the ionization of the metal foreign matters 102 is promoted by the oxidizing agent in the polymer film 101. Thus, by a synergistic effect of the oxidizing agent and the acidic polymer 105, the metal foreign matters 102 can be adsorbed effectively by the polymer film 101.

Figure 6C:
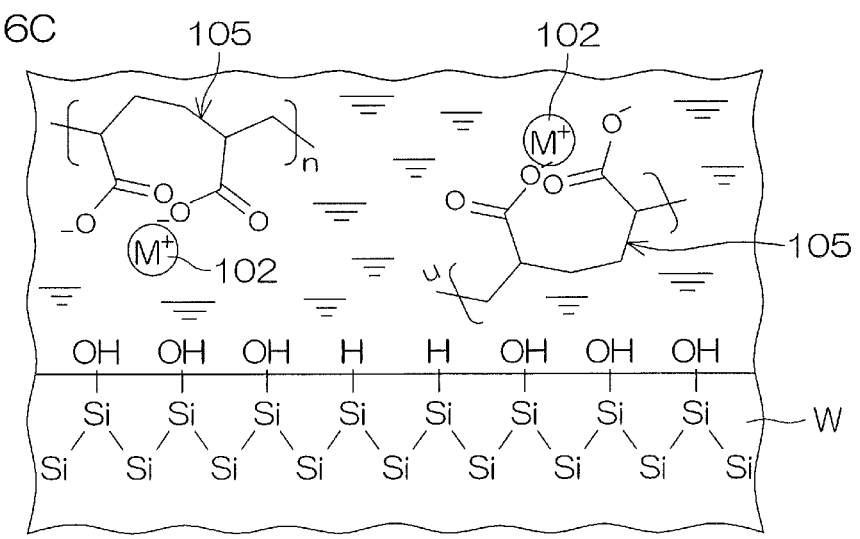
FIG. 6C is a schematic view for describing a condition of removal of the metal foreign matters adhered to the major surface of the substrate.

Since the metal foreign matters 102 are pulled away from the major surface of the substrate W by the action of the polymer film 101, by supplying the rinse liquid to the major surface of the substrate W as shown in FIG. 6C, the polymer film 101 is dissolved in the rinse liquid and expelled outside the substrate W together with the rinse liquid. Together with the polymer film 101, the metal foreign matters 102 are carried along the major surface of the substrate W by the rinse liquid and eventually expelled outside the substrate W. The metal foreign matters 102 are thereby removed from the major surface of the substrate W (metal foreign matter removing step). The major surface of the substrate W is thereby cleaned (rinsing step).

According to the first preferred embodiment, the polymer film 101 of the semisolid state is formed by rotating the substrate W supplied with the polymer-containing liquid. By the action of the acidic polymer in the polymer film 101 of semisolid state, the metal foreign matters 102 are pulled away from the major surface of the substrate W and adsorbed by the polymer film 101 (metal foreign matter adsorbing step). The adsorption of the metal foreign matters 102 by the acidic polymer is promoted by the action of the oxidizing agent in the polymer film 101 of semisolid state (adsorption promoting step). Thus, by forming the polymer film 101 by the polymer-containing liquid of an amount necessary to cover the entirety of the major surface of the substrate W and removing the polymer film 101 by the rinse liquid, the metal foreign matters 102 can be removed satisfactorily from the major surface of the substrate W without continuously supplying the polymer-containing liquid to the major surface of the substrate W.

Since the metal foreign matters 102 can therefore be removed sufficiently without immersing the substrate W in the polymer-containing liquid, a usage amount of the polymer-containing liquid can be reduced. An environmental burden can thereby be reduced.

According to the first preferred embodiment, the polymer-containing liquid is a mixed liquid in which the acidic polymer liquid containing the acidic polymer at 10 wt % and the liquid oxidizing agent containing the oxidizing agent at 30 wt % are mixed at the volume ratio of 1:6. With this ratio, the metal foreign matters 102 can be removed even more efficiently from the major surface of the substrate W.

According to the first preferred embodiment, the polymer-containing liquid is stored in the polymer-containing liquid tank 80. The acidic polymer and the oxidizing agent are thus mixed before being supplied from the polymer-containing liquid tank 80 to the polymer-containing liquid nozzle 8. The ratio of the acidic polymer and the oxidizing agent in the polymer-containing liquid can thus be adjusted more precisely in comparison to an arrangement in which the acidic polymer and the oxidizing agent are mixed in a path leading from the polymer-containing liquid tank 80 to the polymer-containing liquid nozzle 8 or on the major surface of the substrate W.

With the preferred embodiment described above, it was described that the metal foreign matters 102 are pulled away from the major surface of the substrate W by the action of the oxidizing agent and the acidic polymer in the polymer film 101. However, the metal foreign matters 102 can also be pulled away from the major surface of the substrate W by an action of the oxidizing agent and the acidic polymer present in the polymer-containing liquid before the polymer film 101 is formed. However, as described above, the oxidizing agent and the acidic polymer dissolved in the solvent in the polymer film 101 are respectively higher in concentration than the oxidizing agent and the acidic polymer in the polymer-containing liquid. Since the acidic polymer of high concentration can be made to act on the metal foreign matters 102, the metal foreign matters 102 can be adsorbed effectively by the polymer film 101. The metal foreign matters 102 can therefore be pulled away effectively from the major surface of the substrate W by forming the polymer film 101 on the major surface of the substrate W. Further, the metal foreign matters 102 can be removed further from the major surface of the substrate W during the polymer film removal by the rinse liquid.

Since the polymer film 101 contains the solvent and is of semisolid state, the acidic polymer can act more readily on the metal foreign matters 102 than when the polymer film 101 is of solid state. If, unlike in the first preferred embodiment, the polymer film 101 became a solid film with which the solvent evaporated completely immediately after being formed, it is difficult for the acidic polymer to act as an acid. Thus, in comparison to a case where the polymer film 101 is of semisolid state, the metal foreign matters 102 are less likely to be adsorbed by the polymer film 101. In the first preferred embodiment, the polymer film 101 is maintained in the semisolid state from when it is formed until when it is removed. The metal foreign matters 102 are thus adsorbed effectively by the polymer film 101.

Another Example of Substrate Processing According to First Preferred Embodiment

Figure 7:
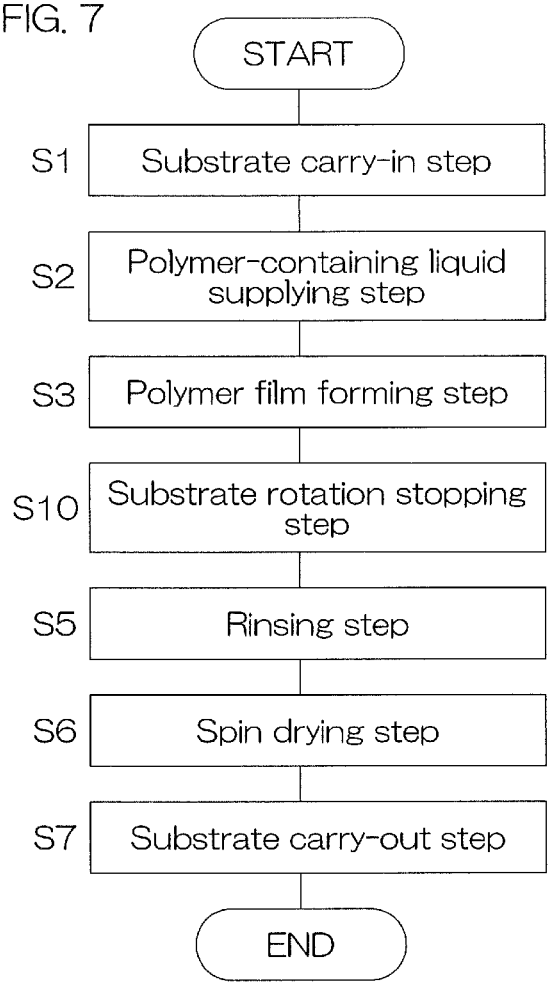
FIG. 7 is a flowchart for describing another example of substrate processing executed by the substrate processing apparatus.
Figure 8:
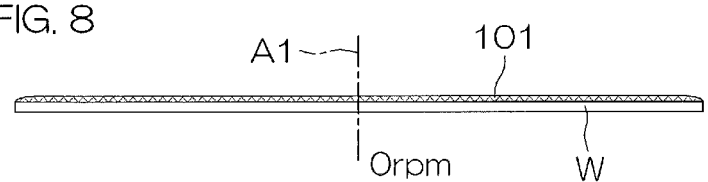
FIG. 8 is a schematic view for describing a condition of a substrate when the other example of substrate processing is being executed by the substrate processing apparatus.

FIG. 7 is a flowchart for describing another example of substrate processing executed by the substrate processing apparatus 1. FIG. 8 is a schematic view for describing a condition of a substrate when the other example of substrate processing is being executed by the substrate processing apparatus 1.

A main point of difference of the present substrate processing with respect to the substrate processing shown in FIG. 4 and FIG. 5A to FIG. 5E is the point that in place of the polymer film heating step (step S4), a substrate rotation stopping step (step S10; rotation stoppage maintaining step) of maintaining a state in which the rotation of the substrate W is stopped for a predetermined time without heating the polymer film 101 is executed as shown in FIG. 7.

In detail, after the polymer film 101 has been formed on the upper surface of the substrate W (after step S3), the spin motor 25 stops the rotation of the substrate W as shown in FIG. 8. Thereafter, the polymer film 101 is left to stand without rotating the substrate W for a predetermined standing time (polymer film standing step). "The polymer film 101 is left to stand" refers to leaving the polymer film 101 alone on the substrate W in the state where the rotation of the substrate W is stopped.

By adopting the present substrate processing, excessive evaporation of the solvent from the polymer film 101 on the major surface of the substrate W can be suppressed by stopping the rotation of the substrate W. The metal foreign matters 102 can thereby be adsorbed effectively by the polymer film 101 by action of the oxidizing agent and the acidic polymer in the polymer film 101 while suppressing the polymer film 101 from solidifying completely.

The solvent in the polymer film 101 evaporates even while the polymer film 101 is left to stand. The concentration (density) of the acidic polymer in the polymer film 101 thus increases (polymer concentrating step).

Figure 9:
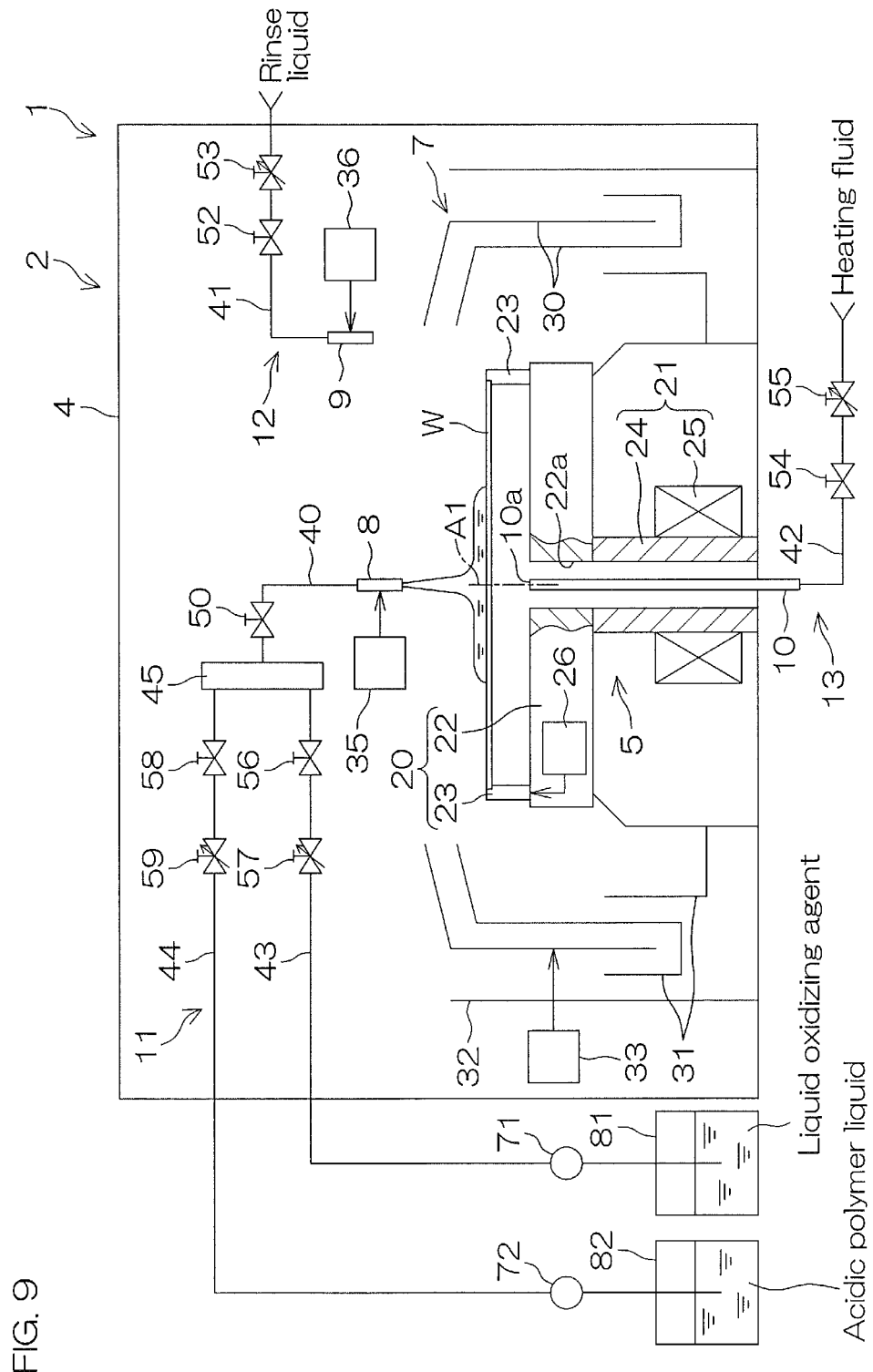
FIG. 9 is a schematic view for describing a first modification example of the substrate processing apparatus.
Figure 10:
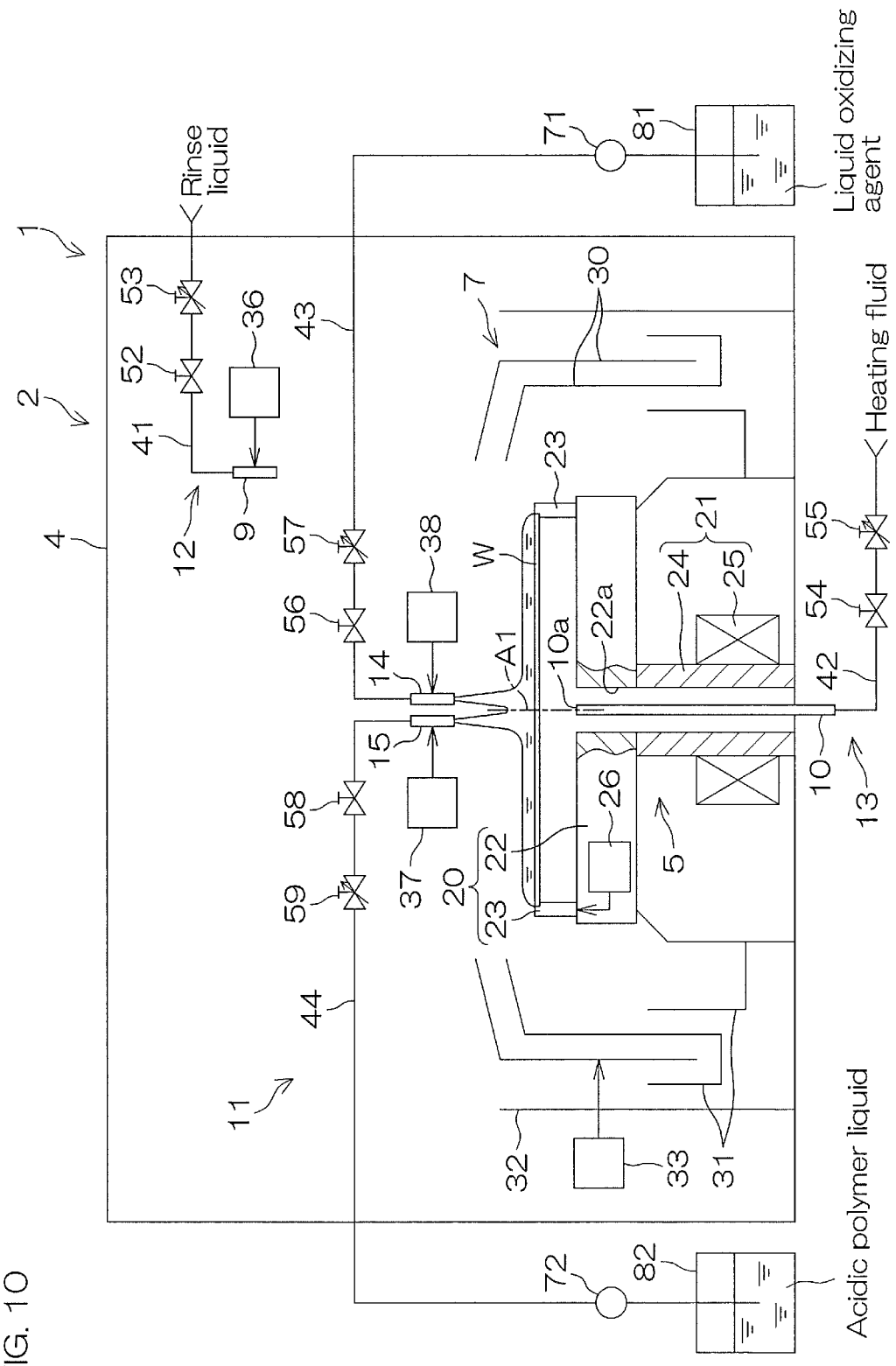
FIG. 10 is a schematic view for describing a second modification example of the substrate processing apparatus.

Modification Examples of Substrate Processing Apparatus According to First Preferred Embodiment FIG. 9 is a schematic view for describing a first modification example of the substrate processing apparatus 1. FIG. 10 is a schematic view for describing a second modification example of the substrate processing apparatus 1. With the first modification example and the second modification example of the substrate processing apparatus 1, a method for supplying the polymer-containing liquid to the upper surface of the substrate W differs from that of the example shown in FIG. 2.

With the first modification example shown in FIG. 9, the liquid oxidizing agent that contains the oxidizing agent and the solvent and the acidic polymer liquid that contains the acidic polymer and the solvent are mixed inside a piping to form the polymer-containing liquid and the polymer-containing liquid formed inside the piping is discharged from the polymer-containing liquid nozzle 8 and supplied to the upper surface of the substrate W (polymer-containing liquid supplying step). The liquid oxidizing agent includes, for example, at least one among hydrogen peroxide water and ozone water.

In detail, the polymer-containing liquid supplying unit 11 according to the first modification example includes the polymer-containing liquid nozzle 8 that discharges the polymer-containing liquid, the polymer-containing liquid piping 40 that guides the polymer-containing liquid to the polymer-containing liquid nozzle 8, a liquid oxidizing agent piping 43 to which the liquid oxidizing agent is supplied from a liquid oxidizing agent tank 81 storing the liquid oxidizing agent, an acidic polymer liquid piping 44 to which the acidic polymer liquid is supplied from an acidic polymer liquid tank 82 storing the acidic polymer liquid, and a mixing piping 45 that is connected to the liquid oxidizing agent piping 43 and the acidic polymer liquid piping 44, mixes the liquid oxidizing agent and the acidic polymer liquid to form the polymer-containing liquid, and feeds the polymer-containing liquid to the polymer-containing liquid piping 40.

The polymer-containing liquid supplying unit 11 includes a liquid oxidizing agent valve 56 that is interposed in the liquid oxidizing agent piping 43 and opens and closes a flow passage inside the liquid oxidizing agent piping 43, a liquid oxidizing agent flow control valve 57 that is interposed in the liquid oxidizing agent piping 43 and adjusts a flow rate of the liquid oxidizing agent inside the liquid oxidizing agent piping 43, an acidic polymer liquid valve 58 that is interposed in the acidic polymer liquid piping 44 and opens and closes a flow passage inside the acidic polymer liquid piping 44, an acidic polymer liquid flow control valve 59 that is interposed in the acidic polymer liquid piping 44 and adjusts a flow rate of the acidic polymer liquid inside the acidic polymer liquid piping 44, and the polymer-containing liquid valve 50 that is interposed in the polymer-containing liquid piping 40 and opens and closes the flow passage inside the polymer-containing liquid piping 40.

A liquid oxidizing agent pump 71 and an acidic polymer liquid pump 72 are interposed respectively in the liquid oxidizing agent piping 43 and the acidic polymer liquid piping 44. Thus, when the liquid oxidizing agent valve 56 is opened, the liquid oxidizing agent inside the liquid oxidizing agent tank 81 is fed to the liquid oxidizing agent piping 43 by the liquid oxidizing agent pump 71. When the acidic polymer liquid valve 58 is opened, the acidic polymer liquid inside the acidic polymer liquid tank 82 is fed to the acidic polymer liquid piping 44 by the acidic polymer liquid pump 72. When the polymer-containing liquid valve 50 is opened, the polymer-containing liquid formed inside the mixing piping 45 is discharged downward in a continuous flow from the discharge port of the polymer-containing liquid nozzle 8 and supplied onto the upper surface of the substrate W (polymer-containing liquid supplying step). The ratio of the acidic polymer and the oxidizing agent in the polymer-containing liquid is adjusted by adjusting opening degrees of the liquid oxidizing agent flow control valve 57 and the acidic polymer liquid flow control valve 59.

Referring to FIG. 10, in the second modification example, the liquid oxidizing agent and the acidic polymer liquid are supplied to the upper surface of the substrate W from separate nozzles and the acidic polymer liquid and the liquid oxidizing agent are mixed on the upper surface of the substrate W to form the polymer-containing liquid. By the polymer-containing liquid being formed on the upper surface of the substrate W, the polymer-containing liquid is supplied to the upper surface of the substrate W (polymer-containing liquid supplying step).

In detail, the polymer-containing liquid supplying unit 11 according to the second modification example includes a liquid oxidizing agent nozzle 14 that discharges the liquid oxidizing agent toward the upper surface of the substrate W held by the spin chuck 5 and an acidic polymer liquid nozzle 15 that discharges the acidic polymer liquid toward the upper surface of the substrate W held by the spin chuck 5. The liquid oxidizing agent piping 43 of the first modification example is connected to the liquid oxidizing agent nozzle 14 and the acidic polymer liquid piping 44 of the first modification example is connected to the acidic polymer liquid nozzle 15.

The polymer-containing liquid supplying unit 11 according to the second modification example further includes the liquid oxidizing agent piping 43, the liquid oxidizing agent valve 56, the liquid oxidizing agent flow control valve 57, the acidic polymer liquid piping 44, the acidic polymer liquid valve 58, and the acidic polymer liquid flow control valve 59.

In the present preferred embodiment, the liquid oxidizing agent nozzle 14 and the acidic polymer liquid nozzle 15 are scan nozzles that are movable in a horizontal direction. The liquid oxidizing agent nozzle 14 and the acidic polymer liquid nozzle 15 are respectively moved in the horizontal direction by a third nozzle moving unit 37 and a fourth nozzle moving unit 38. The third nozzle moving unit 37 and the fourth nozzle moving unit 38 have the same arrangement as the first nozzle moving unit 35.

When the liquid oxidizing agent valve 56 is opened, the liquid oxidizing agent inside the liquid oxidizing agent tank 81 is fed to the liquid oxidizing agent piping 43 by the liquid oxidizing agent pump 71 and discharged downward in a continuous flow from the discharge port of the liquid oxidizing agent nozzle 14. When the acidic polymer liquid valve 58 is opened, the acidic polymer liquid inside the acidic polymer liquid tank 82 is fed to the acidic polymer liquid piping 44 by the acidic polymer liquid pump 72 and discharged downward in a continuous flow from the discharge port of the acidic polymer liquid nozzle 15. When both the liquid oxidizing agent valve 56 and the acidic polymer liquid 58 are opened, the polymer-containing liquid is supplied to the upper surface of the substrate W (polymer-containing liquid supplying step).

Also, with the substrate processing apparatus 1 of each of the first modification example shown in FIG. 9 and the second modification example shown in FIG. 10, it is also possible, unlike in the substrate processing described above, to form the polymer-containing liquid on the substrate W by supplying the liquid oxidizing agent to the upper surface of the substrate W and thereafter supplying the acidic polymer liquid while continuing to supply the liquid oxidizing agent.

Figure 11:
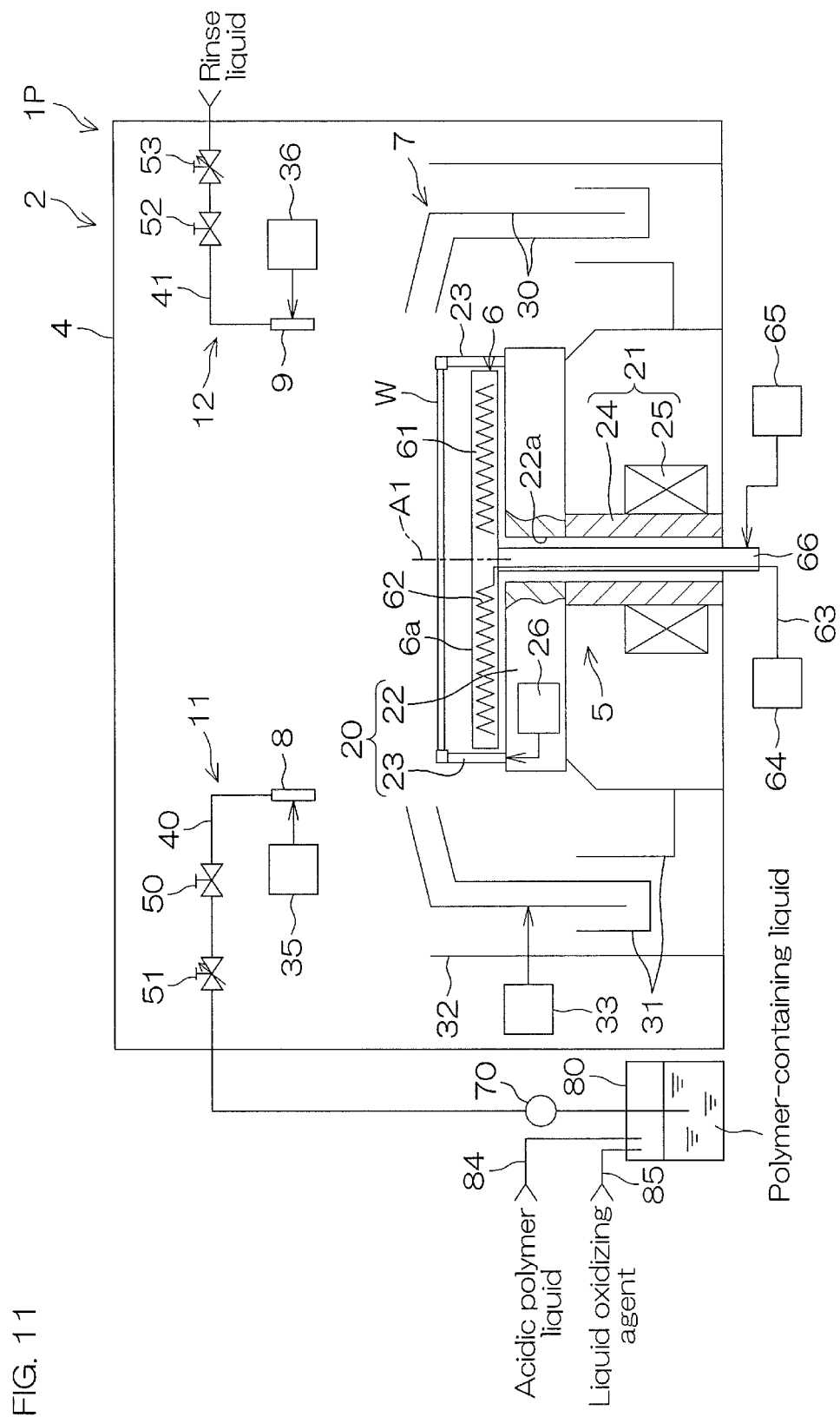
FIG. 11 is a schematic sectional view for describing an arrangement example of the processing unit included in a substrate processing apparatus according to a second preferred embodiment.

Arrangement of Substrate Processing Apparatus According to Second Preferred Embodiment FIG. 11 is a schematic sectional view for describing an arrangement example of the processing unit 2 included in a substrate processing apparatus 1P according to a second preferred embodiment. In FIG. 11, arrangements equivalent to arrangements shown in FIG. 1 to FIG. 10 described above shall be provided with the same reference signs as in FIG. 1, etc., and description thereof shall be omitted. The same applies to FIG. 12 to be described below.

A main point of difference of the substrate processing apparatus 1P according to the second preferred embodiment with respect to the substrate processing apparatus 1 according to the first preferred embodiment (see FIG. 2) is the point that a heater unit 6 is provided in place of the heating fluid supplying unit 13.

The heater unit 6 is an example of a substrate heating unit that heats the entirety of the substrate W. The heater unit 6 has a form of a disk-shaped hot plate. The heater unit 6 is disposed between the upper surface of the spin base 22 and the lower surface of the substrate W. The heater unit 6 has a facing surface 6a facing the lower surface of the substrate W from below.

The heater unit 6 includes a plate main body 61 and a heater 62. The plate main body 61 is slightly smaller than the substrate W in plan view. An upper surface of the plate main body 61 constitutes the facing surface 6a. The heater 62 may be a resistor body incorporated in the plate main body 61. By energizing the heater 62, the facing surface 6a is heated. The facing surface 6a is heated, for example, to 195° C. A temperature of the facing surface 6a may be a temperature not less than 60° C. but less than 100° C.

An elevating/lowering shaft 66 that extends in the vertical direction along the rotational axis A1 is coupled to a lower surface of the heater unit 6. The elevating/lowering shaft 66 is inserted through the penetrating hole 22a formed in the central portion of the spin base 22 and the rotating shaft 24 that is hollow. A feeder line 63 is passed through the elevating/lowering shaft 66.

The heater 62 is supplied with power from a heater energizing unit 64 via the feeder line 63. The heater energizing unit 64 is, for example, a power supply. The heater unit 6 is elevated and lowered by a heater elevating/lowering unit 65.

The heater elevating/lowering unit 65 includes, for example, an actuator (not shown) such as an electric motor or an air cylinder, etc., that elevatingly/loweringly drives the elevating/lowering shaft 66. The heater elevating/lowering unit 65 is also referred to as a heater lifter. The heater elevating/lowering unit 65 elevates and lowers the heater unit 6 via the elevating/lowering shaft 66. The heater unit 6 can be positioned at a lower position and an upper position by being elevated/lowered by the heater elevating/lowering unit 65. The heater elevating/lowering unit 65 is capable of positioning the heater unit 6 not just at the lower position and the upper position but also at any position between the lower position and the upper position.

The heater unit 6 can receive the substrate W from the plurality of chuck pins 23 in the open state when it rises. The heater unit 6 can heat the substrate W by being positioned at a contacting position of contacting the lower surface of the substrate W or at a proximity position being in proximity to the lower surface of the substrate W by the heater elevating/lowering unit 65.

Example of Substrate Processing According to Second Preferred Embodiment

Figure 12:
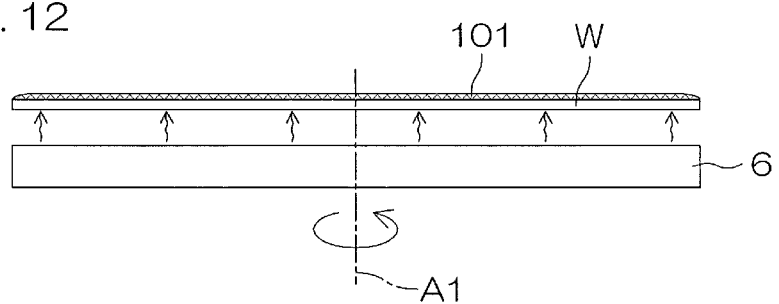
FIG. 12 is a schematic view for describing a condition of a substrate when an example of substrate processing is being performed by the substrate processing apparatus according to the second preferred embodiment.

FIG. 12 is a schematic view for describing a condition of the substrate W when an example of substrate processing is being performed by the substrate processing apparatus 1P according to the second preferred embodiment. The substrate processing apparatus 1P according to the second preferred embodiment can execute substrate processing that is the same as that by the substrate processing apparatus 1 according to the first preferred embodiment (FIG. 4 to FIG. 5E) with the exception that a heating method in the polymer film heating step (step S4) differs.

As shown in FIG. 12, in the polymer film heating step (step S4) in the substrate processing according to the second preferred embodiment, the substrate W is heated by radiant heat by the heater unit 6 being positioned at the proximity position (substrate heating step, heater heating step). The heater unit 6 heats the polymer film 101 via the substrate W (polymer film heating step). While the heater unit 6 is put in proximity to the substrate W, the substrate W is rotated at a predetermined heater heating speed. The heater heating speed is, for example, 800 rpm. The heater unit 6 may be moved to the lower position in the subsequent rinsing step (step S5) or the heater unit 6 may be positioned at the proximity position until the spin drying (step S6) ends.

When the heater unit 6 is positioned at the proximity position to heat the substrate W and the polymer film 101, the temperature of the facing surface 6a is preferably a temperature enabling heating such that the temperature of the substrate W does not exceed the boiling point of the solvent in the polymer film 101 and the temperature of the facing surface 6a is adjusted to a temperature (of, for example, not less than 100° C.) that is higher than the boiling point of the solvent in the polymer film 101.

Unlike in the example shown in FIG. 12, the polymer film heating step may be executed by positioning the heater unit 6 at the contacting position. When the heater unit 6 is positioned at the contacting position, the rotation of the substrate W is restricted and therefore, the polymer film 101 on the substrate W is left to stand. When the heater unit 6 is positioned at the contacting position, the temperature of the facing surface 6a is preferably a temperature lower than the boiling point of the solvent in the polymer film 101. If the solvent is DIW, the temperature of the facing surface 6a is preferably not less than 60° C. but less than 100° C.

According to the second preferred embodiment, the same effects as the first preferred embodiment are exhibited. The same modification examples as those of the first preferred embodiment can be applied to the second preferred embodiment as well. That is, the liquid oxidizing agent and the acidic polymer liquid may be mixed inside a piping to form the polymer-containing liquid and the polymer-containing liquid formed inside the piping may be discharged from the polymer-containing liquid nozzle 8. Or, the liquid oxidizing agent and the acidic polymer liquid may be supplied to the upper surface of the substrate W from separate nozzles and the polymer-containing liquid may be formed by the acidic polymer liquid and the liquid oxidizing agent being mixed on the upper surface of the substrate W.

Figure 13:
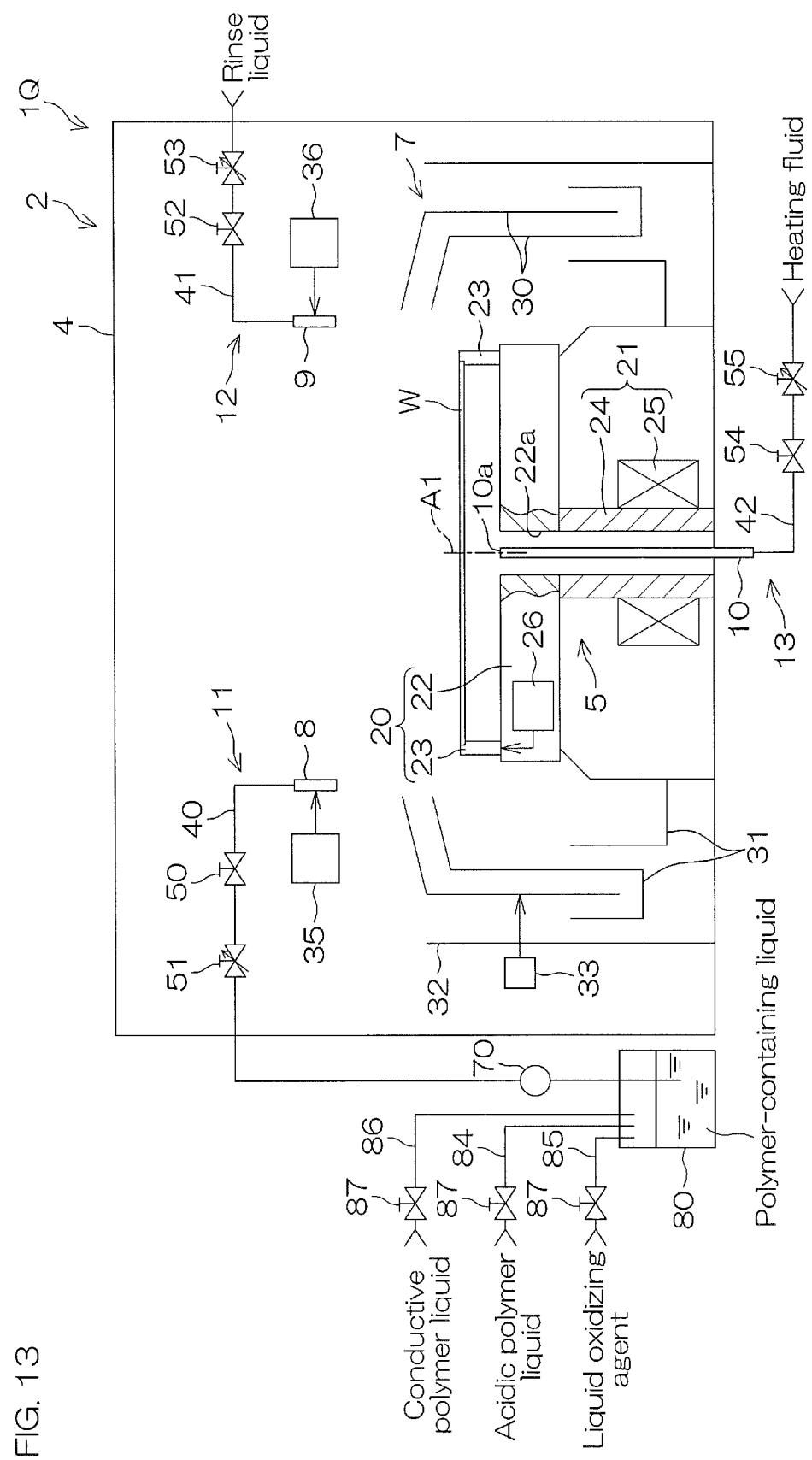
FIG. 13 is a schematic sectional view for describing an arrangement example of the processing unit included in a substrate processing apparatus according to a third preferred embodiment.

Arrangement of Substrate Processing Apparatus According to Third Preferred Embodiment FIG. 13 is a schematic sectional view for describing an arrangement example of the processing unit 2 included in a substrate processing apparatus 1Q according to a third preferred embodiment. In FIG. 13, arrangements equivalent to arrangements shown in FIG. 1 to FIG. 12 described above shall be provided with the same reference signs as in FIG. 1, etc., and description thereof shall be omitted. The same applies to FIG. 14 to FIG. 16 to be described below.

A main point of difference of the substrate processing apparatus 1Q according to the third preferred embodiment with respect to the substrate processing apparatus 1 according to the first preferred embodiment (see FIG. 2) is the point that the polymer-containing liquid contains a conductive polymer such as polyacetylene, etc., in addition to the solvent, the acidic polymer, and the oxidizing agent.

As with the solvent, the conductive polymer acts as a medium for release of protons by the acidic polymer. The conductive polymer is not restricted to polyacetylene. The conductive polymer is a conjugated polymer having conjugated double bonds. The conjugated polymer is, for example, an aliphatic conjugated polymer such as polyacetylene, etc., an aromatic conjugated polymer such as poly(p-phenylene), etc., a mixed conjugated polymer such as poly(p-phenylenevinylene), etc., a heterocyclic conjugated polymer such as polypyrrole, polythiophene, poly(3,4-ethylenedioxythiophene) (PEDOT), etc., a hetero-atom containing conjugated polymer such as polyaniline, etc., a double-chain conjugated polymer such as polyacene, etc., a two-dimensional conjugated polymer such as graphene, etc., or a mixture of these.

For example, apart from the liquid oxidizing agent and the acidic polymer liquid, a conductive polymer liquid is replenished into the polymer-containing liquid tank 80 via a replenishing pipe 86. A plurality of replenishing valves 87 that open and close flow passages inside the corresponding replenishing pipes 84 to 86 are respectively interposed in the plurality of replenishing pipes 84 to 86.

Unlike in the example shown in FIG. 13, the polymer-containing liquid may be replenished via a polymer-containing liquid replenishing pipe (not shown). The conductive polymer liquid is a liquid that contains the solvent described above and the conductive polymer.

Example of Substrate Processing According to Third Preferred Embodiment

The same substrate processing as the substrate processing according to the first preferred embodiment (see FIG. 4 to FIG. 5E) is made possible by using the substrate processing apparatus 1Q according to the third preferred embodiment. That is, the polymer-containing liquid that contains the acidic polymer, the liquid oxidizing agent, and the conductive polymer is stored in the polymer-containing liquid tank 80 (preparation step). The polymer film 101 that is formed in the polymer film forming step (step S3) thus contains the conductive polymer in addition to the acidic polymer and the oxidizing agent.

Since the conductive polymer functions as a medium for release of protons by the acidic polymer, the acidic polymer can be ionized by the action of the conductive polymer in the state where the polymer film 101 is formed on the substrate W. Thus, even if the solvent is completely eliminated from the polymer film 101 and the polymer film is of solid state, the acidic polymer can be ionized and the ionized acidic polymer can be made to act effectively on the metal foreign matters 102.

Figure 14:
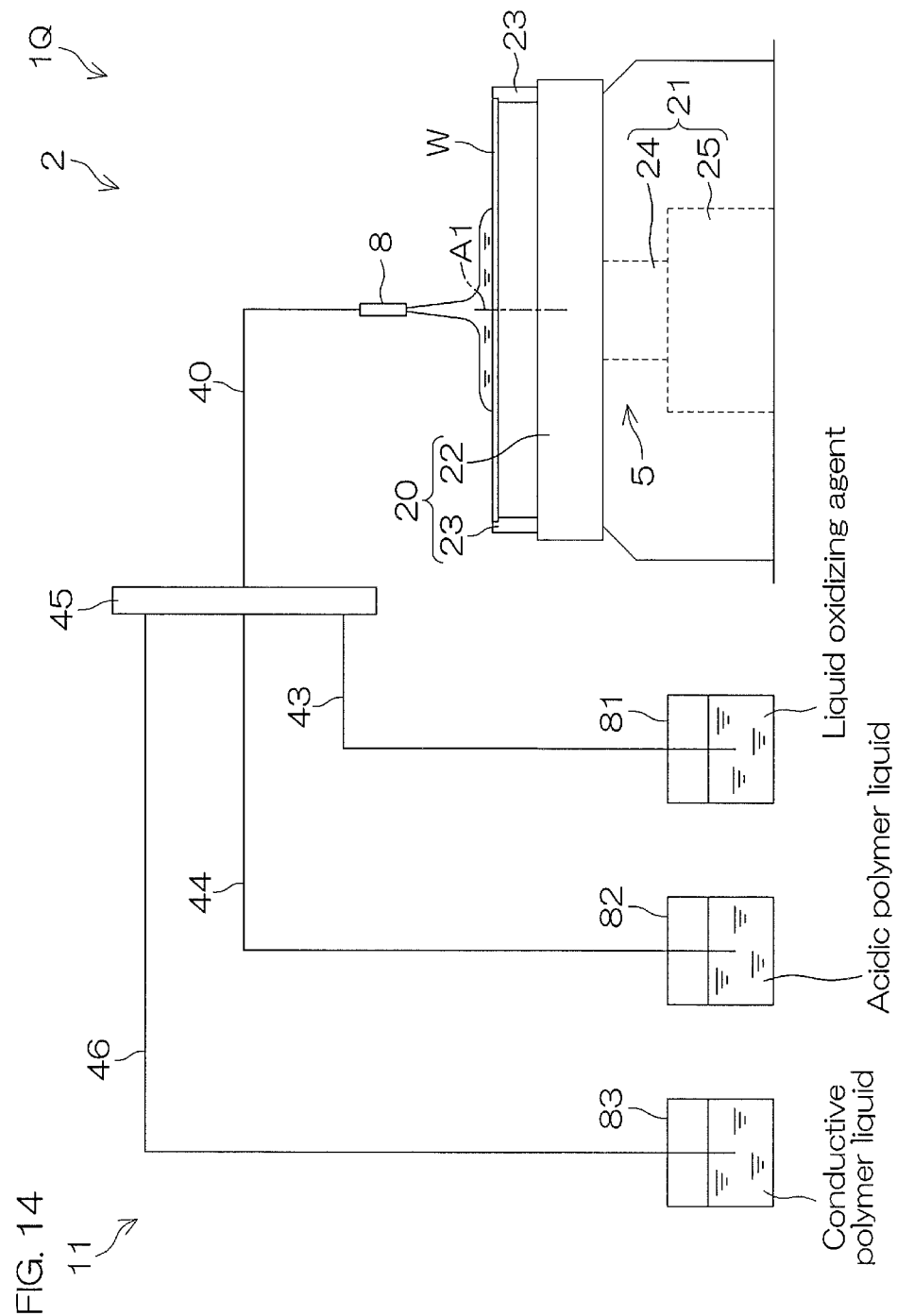
FIG. 14 is a schematic view for describing a first modification example of the substrate processing apparatus according to the third preferred embodiment.
Figure 15:
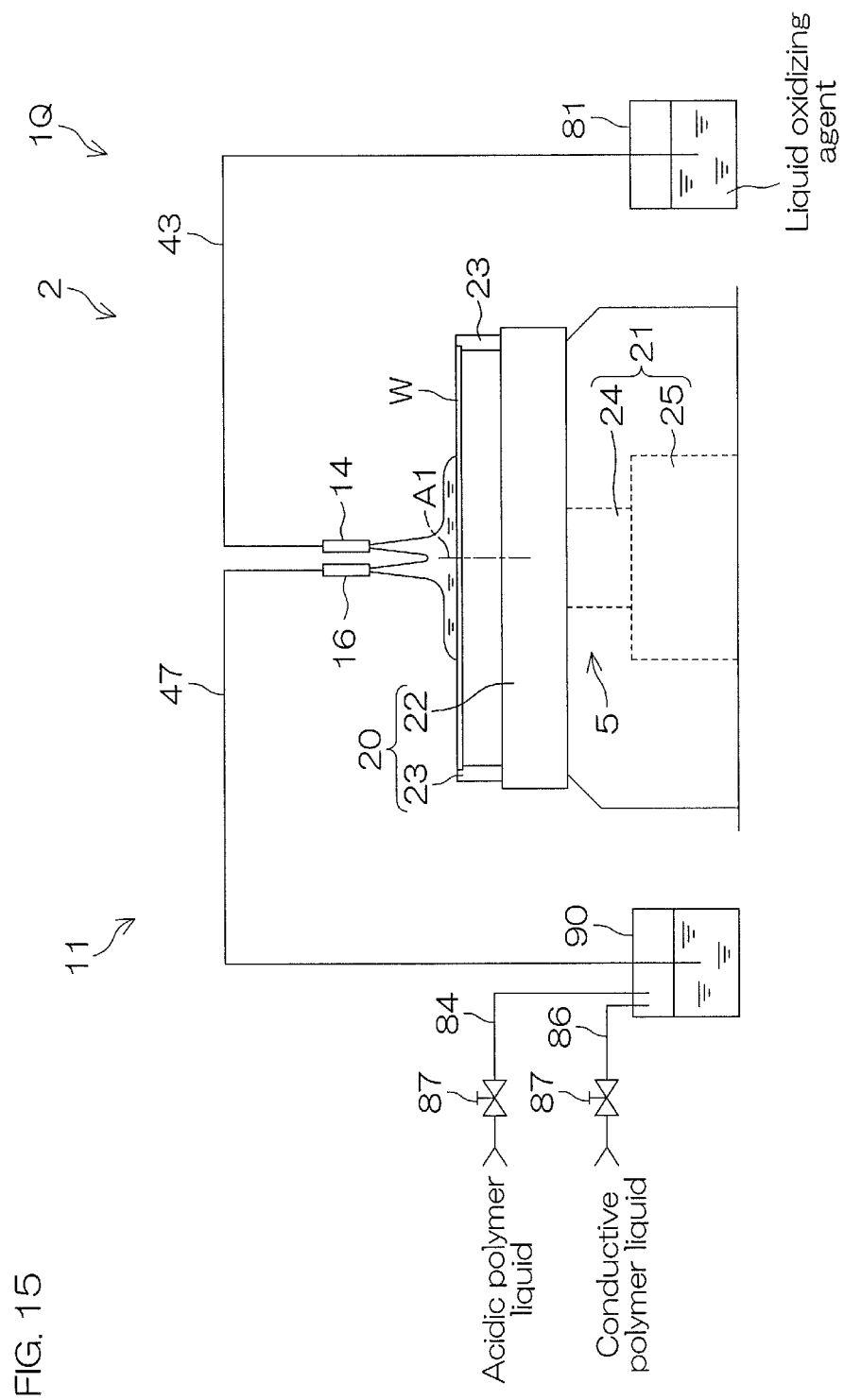
FIG. 15 is a schematic view for describing a second modification example of the substrate processing apparatus according to the third preferred embodiment.
Figure 16:
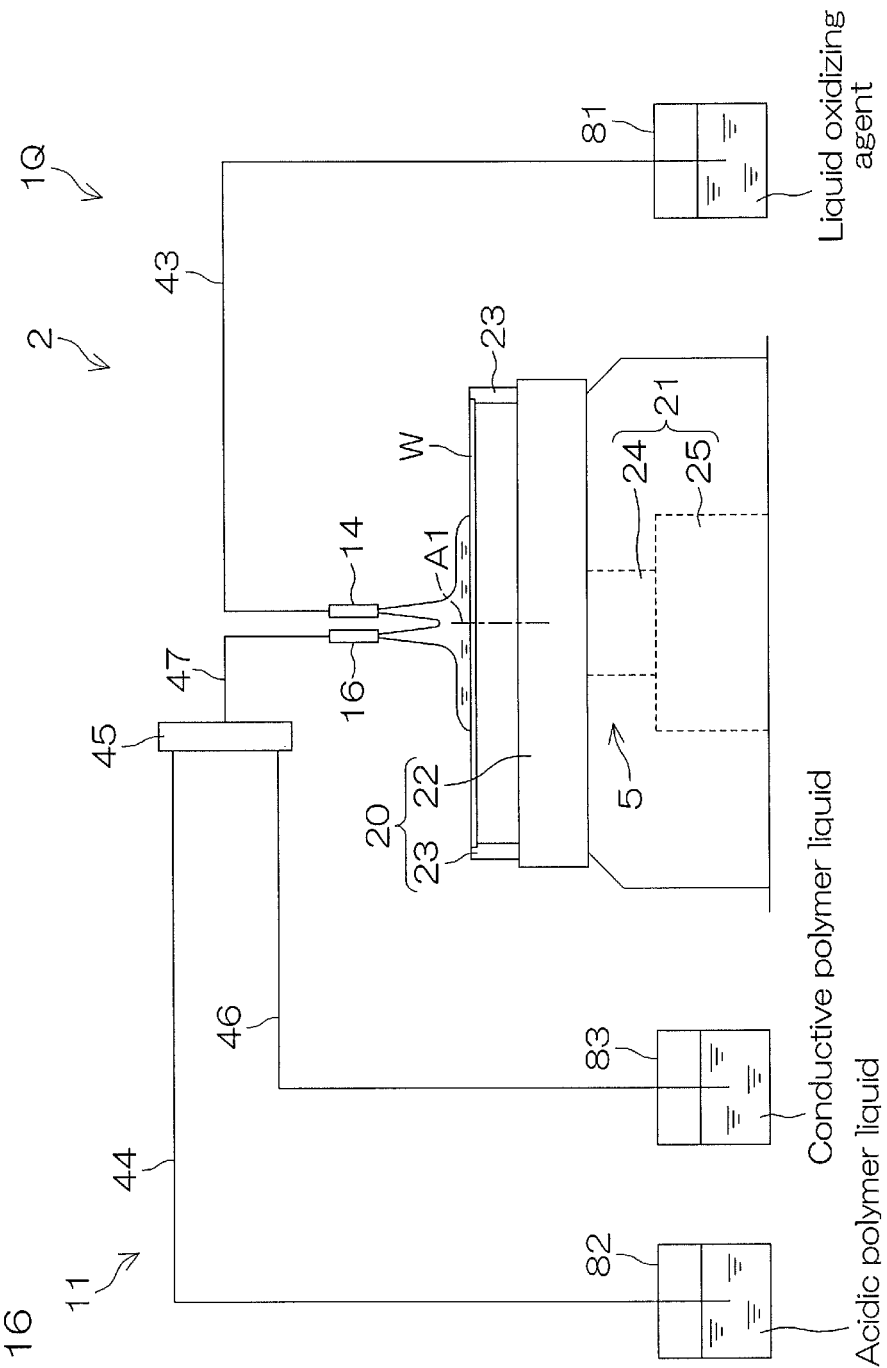
FIG. 16 is a schematic view for describing a third modification example of the substrate processing apparatus according to the third preferred embodiment.
Figure 17:
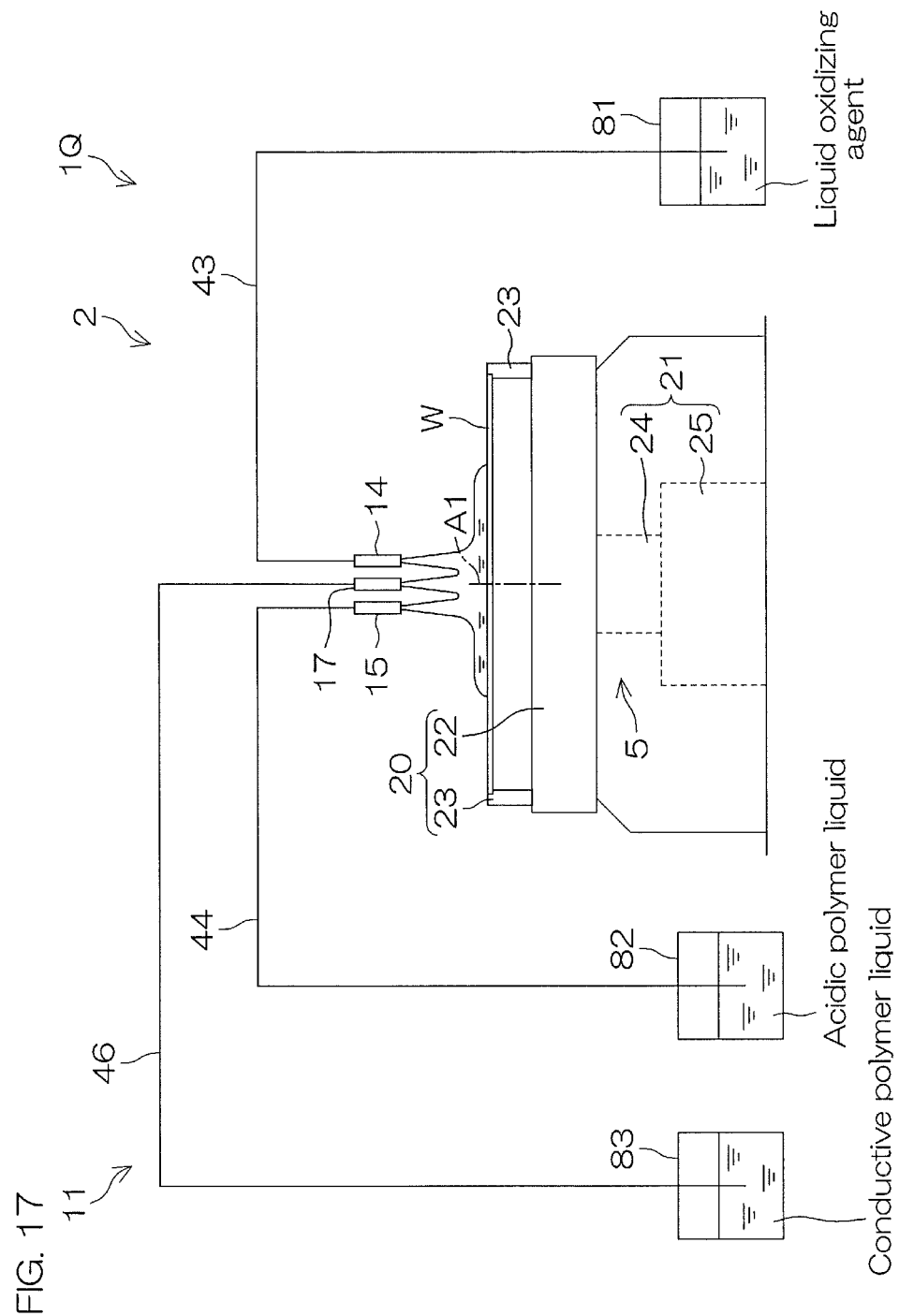
FIG. 17 is a schematic view for describing a fourth modification example of the substrate processing apparatus according to the third preferred embodiment.

Modification Examples of Substrate Processing Apparatus According to Third Preferred Embodiment FIG. 14 is a schematic view for describing a first modification example of the substrate processing apparatus 1Q. FIG. 15 is a schematic view for describing a second modification example of the substrate processing apparatus 1Q. FIG. 16 is a schematic view for describing a third modification example of the substrate processing apparatus 1Q. FIG. 17 is a schematic view for describing a fourth modification example of the substrate processing apparatus 1Q.

With the first modification example to fourth modification example of the substrate processing apparatus 1Q, a method for supplying the polymer-containing liquid to the upper surface of the substrate W differs from that of the example shown in FIG. 13. With the modification examples shown in FIG. 14 to FIG. 17, illustrations of the processing cup 7 and the rinse liquid nozzle 9 are omitted for convenience of description. Although a description shall be given with descriptions of the pumps, valves, nozzle moving units, etc., being omitted, this does not mean that these members are not present and in actuality, these members are provided at appropriate positions.

With the first modification example shown in FIG. 14, the liquid oxidizing agent, the acidic polymer liquid, and the conductive polymer liquid are mixed inside the mixing piping 45 to form the polymer-containing liquid and the polymer-containing liquid formed inside the mixing piping 45 is discharged from the polymer-containing liquid nozzle 8 and supplied to the upper surface of the substrate W (polymer-containing liquid supplying step).

In detail, together with the liquid oxidizing agent piping 43 and the acidic polymer liquid piping 44, a conductive polymer liquid piping 46 that guides the conductive polymer liquid inside a conductive polymer liquid tank 83 to the mixing piping 45 is connected to the mixing piping 45 and the conductive polymer liquid, the acidic polymer liquid, and the liquid oxidizing agent are mixed inside the mixing piping 45. In the present modification example, the mixing piping 45 and the conductive polymer liquid piping 46 are also included in the polymer-containing liquid supplying unit 11.

With the second modification example shown in FIG. 15, the acidic polymer liquid and the conductive polymer liquid are mixed inside a mixing tank 90 to form a mixed polymer liquid. The acidic polymer liquid and the conductive polymer liquid are supplied respectively from the two replenishing pipes 84 and 86 into the mixing tank 90. The mixed polymer liquid formed inside the mixing tank 90 is supplied to a mixed polymer liquid nozzle 16 via a mixed polymer liquid piping 47. The mixed polymer liquid is discharged toward the upper surface of the substrate W from the mixed polymer liquid nozzle 16 and supplied to the upper surface of the substrate W (mixed polymer liquid supplying step).

In parallel to the supply of the mixed polymer liquid to the upper surface of the substrate W, the liquid oxidizing agent is supplied toward the upper surface of the substrate W from a nozzle (liquid oxidizing agent nozzle 14) differing from the mixed polymer liquid nozzle 16 and thereby, the mixed polymer liquid and the liquid oxidizing agent are mixed on the upper surface of the substrate W to form the polymer-containing liquid. By the polymer-containing liquid being formed on the upper surface of the substrate W, the polymer-containing liquid is supplied to the upper surface of the substrate W (polymer-containing liquid supplying step).

With the third modification example shown in FIG. 16, the acidic polymer liquid supplied from the acidic polymer liquid piping 44 and the conductive polymer liquid supplied from the conductive polymer liquid piping 46 are mixed inside the mixing piping 45 to form the mixed polymer liquid. The mixed polymer liquid formed inside the mixing piping 45 is supplied to the mixed polymer liquid nozzle 16 via the mixed polymer liquid piping 47. The mixed polymer liquid is discharged from the mixed polymer liquid nozzle 16 and supplied to the upper surface of the substrate W (mixed polymer liquid supplying step).

In parallel to the supply of the mixed polymer liquid to the upper surface of the substrate W, the liquid oxidizing agent is supplied toward the upper surface of the substrate W from a nozzle (liquid oxidizing agent nozzle 14) differing from the mixed polymer liquid nozzle 16 and thereby, the mixed polymer liquid and the liquid oxidizing agent are mixed on the upper surface of the substrate W to form the polymer-containing liquid. By the polymer-containing liquid being formed on the upper surface of the substrate W, the polymer-containing liquid is supplied to the upper surface of the substrate W (polymer-containing liquid supplying step).

With the fourth modification example shown in FIG. 17, the acidic polymer liquid, the liquid oxidizing agent, and the conductive polymer liquid are supplied to the upper surface of the substrate W from separate nozzles and the liquids are mixed on the upper surface of the substrate W to form the polymer-containing liquid on the upper surface of the substrate W. By the polymer-containing liquid being formed on the upper surface of the substrate W, the polymer-containing liquid is supplied to the upper surface of the substrate W (polymer-containing liquid supplying step).

In detail, the acidic polymer liquid is discharged from the acidic polymer liquid nozzle 15 and the liquid oxidizing agent is discharged from the liquid oxidizing agent nozzle 14. The conductive polymer liquid is supplied to a conductive polymer liquid nozzle 17 via the conductive polymer liquid piping 46 connected to the conductive polymer liquid tank 83. The conductive polymer liquid is discharged from the conductive polymer liquid nozzle 17 and supplied to the upper surface of the substrate W.

Figure 18:
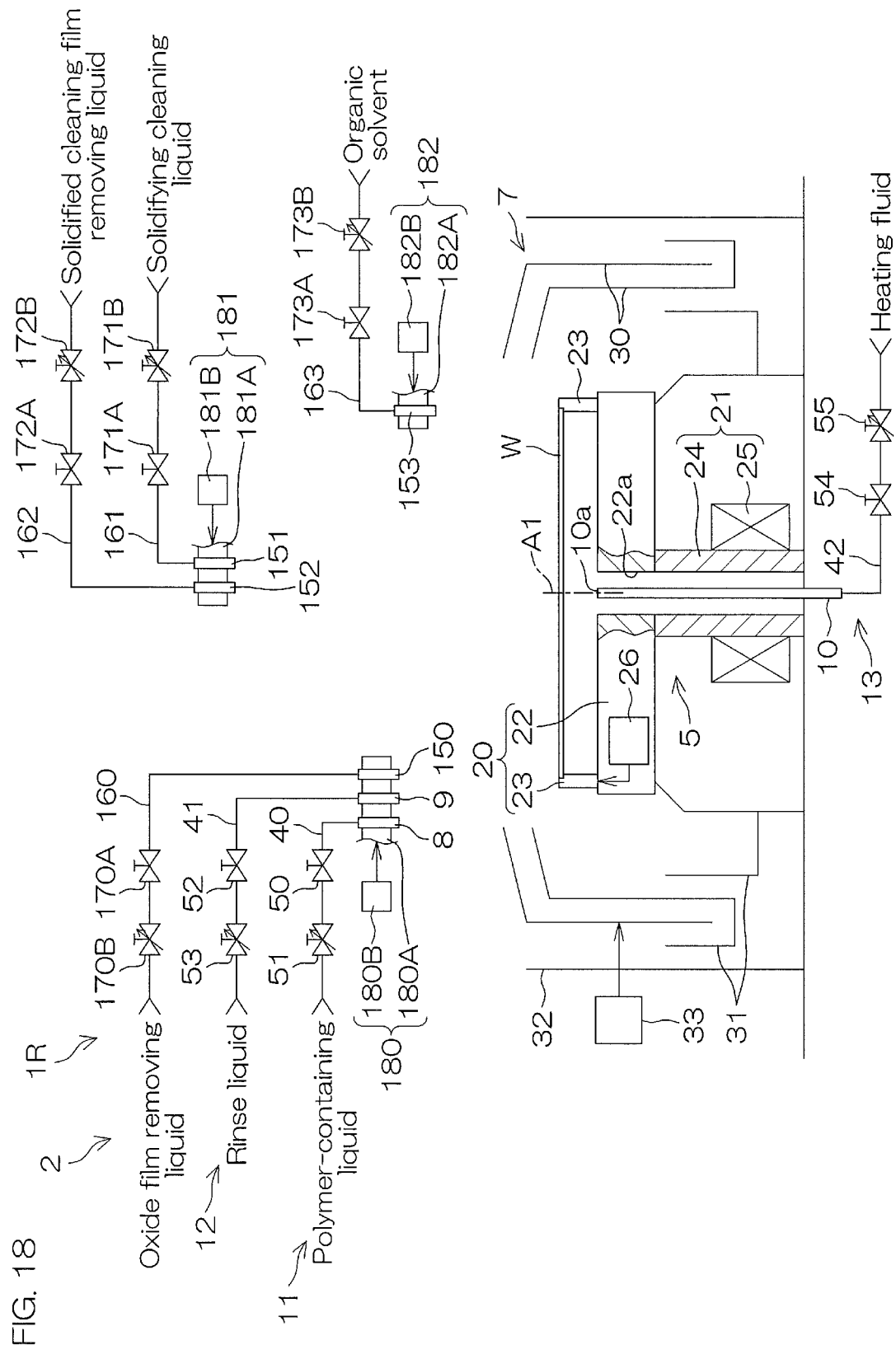
FIG. 18 is a schematic sectional view for describing an arrangement example of the processing unit included in a substrate processing apparatus according to a fourth preferred embodiment.

Arrangement of Substrate Processing Apparatus According to Fourth Preferred Embodiment FIG. 18 is a schematic sectional view for describing an arrangement example of the processing unit 2 included in a substrate processing apparatus 1R according to a fourth preferred embodiment. In FIG. 18, arrangements equivalent to arrangements shown in FIG. 1 to FIG. 17 described above shall be provided with the same reference signs as in FIG. 1, etc., and description thereof shall be omitted. The same applies to FIG. 19 and FIG. 21 to be described below.

Main points of difference of the substrate processing apparatus 1R according to the fourth preferred embodiment with respect to the substrate processing apparatus 1 according to the first preferred embodiment (see FIG. 2) are the point that the oxidizing agent is not contained in the polymer-containing liquid discharged from the polymer-containing liquid nozzle 8 and the point that a solidifying cleaning liquid is suppliable to the substrate W. The acidic polymer liquid is used as the polymer-containing liquid in the fourth preferred embodiment.

The acidic polymer according to the fourth preferred embodiment is preferably higher in acidity than the polymer-containing liquid that contains the oxidizing agent and a pH of the polymer-containing liquid is not more than 1. If so, metal foreign matters can be removed sufficiently from the upper surface of the substrate W even if the oxidizing agent is not contained in the acidic polymer. The acidic polymer is, for example, a carboxy-group-containing polymer, a sulfo-group-containing polymer, or a mixture of these. Details of the carboxy-group-containing polymer and the sulfo-group-containing polymer are as have been described above.

The substrate processing apparatus 1R further includes an oxide film removing liquid nozzle 150 that discharges an oxide film removing liquid toward the upper surface of the substrate W held by the spin chuck 5, a solidifying cleaning liquid nozzle 151 that discharges a solidifying cleaning liquid toward the upper surface of the substrate W held by the spin chuck 5, a solidified cleaning film removing liquid nozzle 152 that discharges a solidified cleaning film removing liquid toward the upper surface of the substrate W held by the spin chuck 5, and an organic solvent nozzle 153 that discharges an organic solvent toward the upper surface of the substrate W held by the spin chuck 5.

The oxide film removing liquid discharged from the oxide film removing liquid nozzle 150 is a liquid that removes an oxide film (for example, a natural oxide film) of silicon oxide, etc., that is exposed from the upper surface of the substrate W. The oxide film removing liquid is, for example, hydrofluoric acid.

The oxide film removing liquid nozzle 150 is connected to one end of an oxide film removing liquid piping 160 that guides the oxide film removing liquid to the oxide film removing liquid nozzle 150. An oxide film removing liquid valve 170A that opens and closes a flow passage inside the oxide film removing liquid piping 160 and an oxide film removing liquid flow control valve 170B that adjusts a flow rate of the oxide film removing liquid inside the flow passage are interposed in the oxide film removing liquid piping 160. When the oxide film removing liquid valve 170A is opened, the oxide film removing liquid is discharged from the oxide film removing liquid nozzle 150 toward the upper surface of the substrate W at a flow rate in accordance with an opening degree of the oxide film removing liquid flow control valve 170B.

The solidifying cleaning liquid that is discharged from the solidifying cleaning liquid nozzle 151 contains a component that forms a solidified cleaning film of semisolid state or solid state. The solidifying cleaning liquid contains, for example, a low solubility component, a high solubility component that is higher in solubility in the removing liquid than the low solubility component, and a solvent that dissolve the low solubility component and the high solubility component. The solvent is, for example, an organic solvent such as IPA (isopropanol), etc.

The low solubility component is, for example, a polymer. In detail, the low solubility component may contain at least one among novolacs, polyhydroxystyrenes, polystyrenes, polyacrylic acid derivatives, polymaleic acid derivatives, polycarbonates, polyvinyl alcohol derivatives, polymethacrylic acid derivatives, and copolymers that are combinations of these.

The high solubility component may be a crack promoting component and may contain a hydrocarbon and a hydroxy group and/or carbonyl group in the molecule. The high solubility component may be a substance that is represented by at least one among (B-1), (B-2), and (B-3) indicated below.

(B-1) is a compound that contains 1 to 6 of chemical formula 1 as a constituent unit and with which each constituent unit is bonded by a linking group $L_1$.

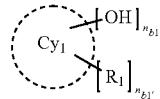

[Chemical Formula 1]

Here, $L_1$ is selected from at least among a single bond and $C_{1~6}$ alkylenes, $Cy_1$ is a hydrocarbon ring of $C_{5~30}$, $R_1$ is each independently an alkyl of $C_{1~5}$, $n_{b1}$ is 1, 2, or 3, and $n_{b1'}$ is 0, 1, 2, 3, or 4.

(B-2) is a compound that is represented by chemical formula 2.

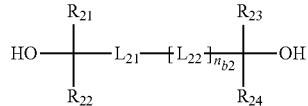

[Chemical Formula 2]

Here, $R_{21}$, $R_{22}$, $R_{23}$, and $R_{24}$ are each independently hydrogen or an alkyl of $C_{1~5}$, $L_{21}$ and $L_{22}$ are each independently an alkylene of $C_{1~20}$, a cycloalkylene of $C_{1~20}$, an alkenylene of $C_{2~4}$, an alkynylene of $C_{2~4}$, or an arylene of $C_{6~20}$, these groups may be substituted with an alkyl of $C_{1~5}$ or hydroxy, and $n_{b2}$ is 0, 1, or 2.

(B-3) is a polymer that contains constituent units represented by chemical formula 3 and has a weight average molecular weight (Mw) of 500 to 10,000.

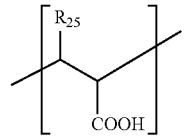

[Chemical Formula 3]

$R_{25}$ is —H, —$CH_3$, or —COOH.

Details of the low solubility component, the high solubility component, and the solvent contained in the solidifying cleaning liquid are disclosed, for example, in Japanese Patent Application Publication No. 2019-212889. The "second component," the "first component," and the "solvent" disclosed in Japanese Patent Application Publication No. 2019-212889 can be used respectively as the low solubility component, the high solubility component, and the solvent.

The solidifying cleaning liquid nozzle 151 is connected to one end of a solidifying cleaning liquid piping 161 that guides the solidifying cleaning liquid to the solidifying cleaning liquid nozzle 151. A solidifying cleaning liquid valve 171A that opens and closes a flow passage inside the solidifying cleaning liquid piping 161 and a solidifying cleaning liquid flow control valve 171B that adjusts a flow rate of the solidifying cleaning liquid inside the flow passage are interposed in the solidifying cleaning liquid piping 161. When the solidifying cleaning liquid valve 171A is opened, the solidifying cleaning liquid is discharged from the solidifying cleaning liquid nozzle 151 toward the upper surface of the substrate W at a flow rate in accordance with an opening degree of the solidifying cleaning liquid flow control valve 171B.

By at least a portion of the solvent evaporating (volatilizing) from the solidifying cleaning liquid supplied to the upper surface of the substrate W, the solidified cleaning film of solid state or semisolid state that contains the low solubility component and the high solubility component are formed.

The solidified cleaning film removing liquid that is discharged from the solidified cleaning film removing liquid nozzle 152 is a liquid that peels off and removes the solidified cleaning film from the major surface of the substrate W. The solidified cleaning film removing liquid is, for example, an alkaline liquid such as ammonia water, etc.

By the solidified cleaning film removing liquid being supplied to the solidified cleaning film on the substrate W, the high solubility component in the solidified cleaning film is dissolved and starting with the dissolution of the high solubility component, cracks form in the solidified cleaning film. By thereafter continuing to supply the solidified cleaning film removing liquid, the solidified cleaning film splits to become film pieces and is peeled off from the upper surface of the substrate W. The film pieces are eliminated from the upper surface of the substrate W together with the solidified cleaning film removing liquid. Since the film pieces are peeled off from the upper surface of the substrate W in a state of holding particulate foreign matters such as particles, etc., that were adhered to the upper surface of the substrate W, the particulate foreign matters are removed from the upper surface of the substrate W. The particulate foreign matters are constituted of at least one of either organic matter and inorganic matter.

A method of thus solidifying a liquid (solidifying cleaning liquid) adhered to the major surface of the substrate W to form a film (solidified cleaning film) of solid state or semisolid state and thereafter removing the film by peeling off to clean the major surface of the substrate W is referred to as solidification cleaning.

The solidified cleaning film removing liquid nozzle 152 is connected to one end of a solidified cleaning film removing liquid piping 162 that guides the solidified cleaning film removing liquid to the solidified cleaning film removing liquid nozzle 152. A solidified cleaning film removing liquid valve 172A that opens and closes a flow passage inside the solidified cleaning film removing liquid piping 162 and a solidified cleaning film removing liquid flow control valve 172B that adjusts a flow rate of the solidified cleaning film removing liquid inside the flow passage are interposed in the solidified cleaning film removing liquid piping 162. When the solidified cleaning film removing liquid valve 172A is opened, the solidified cleaning film removing liquid is discharged from the solidified cleaning film removing liquid nozzle 152 toward the upper surface of the substrate W at a flow rate in accordance with an opening degree of the solidified cleaning film removing liquid flow control valve 172B.

The organic solvent discharged from the organic solvent nozzle 153 functions as a residue removing liquid that removes, from the major surface of the substrate W, residues remaining on the major surface of the substrate W after the solidified cleaning film has been removed. Also, the organic solvent is miscible with both the rinse liquid and the solidifying cleaning liquid. The organic solvent is, for example, IPA but is not restricted to IPA.

The organic solvent nozzle 153 is connected to one end of an organic solvent piping 163 that guides the organic solvent to the organic solvent nozzle 153. An organic solvent valve 173A that opens and closes a flow passage inside the organic solvent piping 163 and an organic solvent flow control valve 173B that adjusts a flow rate of the organic solvent inside the flow passage are interposed in the organic solvent piping 163. The organic solvent nozzle 153 may be arranged such as to be able to discharge an inert gas together with the organic solvent.

In the present preferred embodiment, the processing unit 2 includes a first scanning unit 180 that moves the polymer-containing liquid nozzle 8, the rinse liquid nozzle 9, and the oxide film removing liquid nozzle 150 horizontally at the same time, a second scanning unit 181 that moves the solidifying cleaning liquid nozzle 151 and the solidified cleaning film removing liquid nozzle 152 horizontally at the same time, and a third scanning unit 182 that moves the organic solvent nozzle 153 horizontally.

The first scanning unit 180 includes a first supporting member 180A that supports the polymer-containing liquid nozzle 8, the rinse liquid nozzle 9, and the oxide film removing liquid nozzle 150 in common and a first driving mechanism 180B that drives the first supporting member 180A. The second scanning unit 181 includes a second supporting member 181A that supports the solidifying cleaning liquid nozzle 151 and the solidified cleaning film removing liquid nozzle 152 in common and a second driving mechanism 181B that drives the second supporting member 181A. The third scanning unit 182 includes a third supporting member 182A that supports the organic solvent nozzle 153 and a third driving mechanism 182B that drives the third supporting member 182A. In a substrate processing to be described below, a processing position at which a nozzle that discharges a fluid is positioned in each step is, for example, the central position.

Example of Substrate Processing According to Fourth Preferred Embodiment

Figure 19:
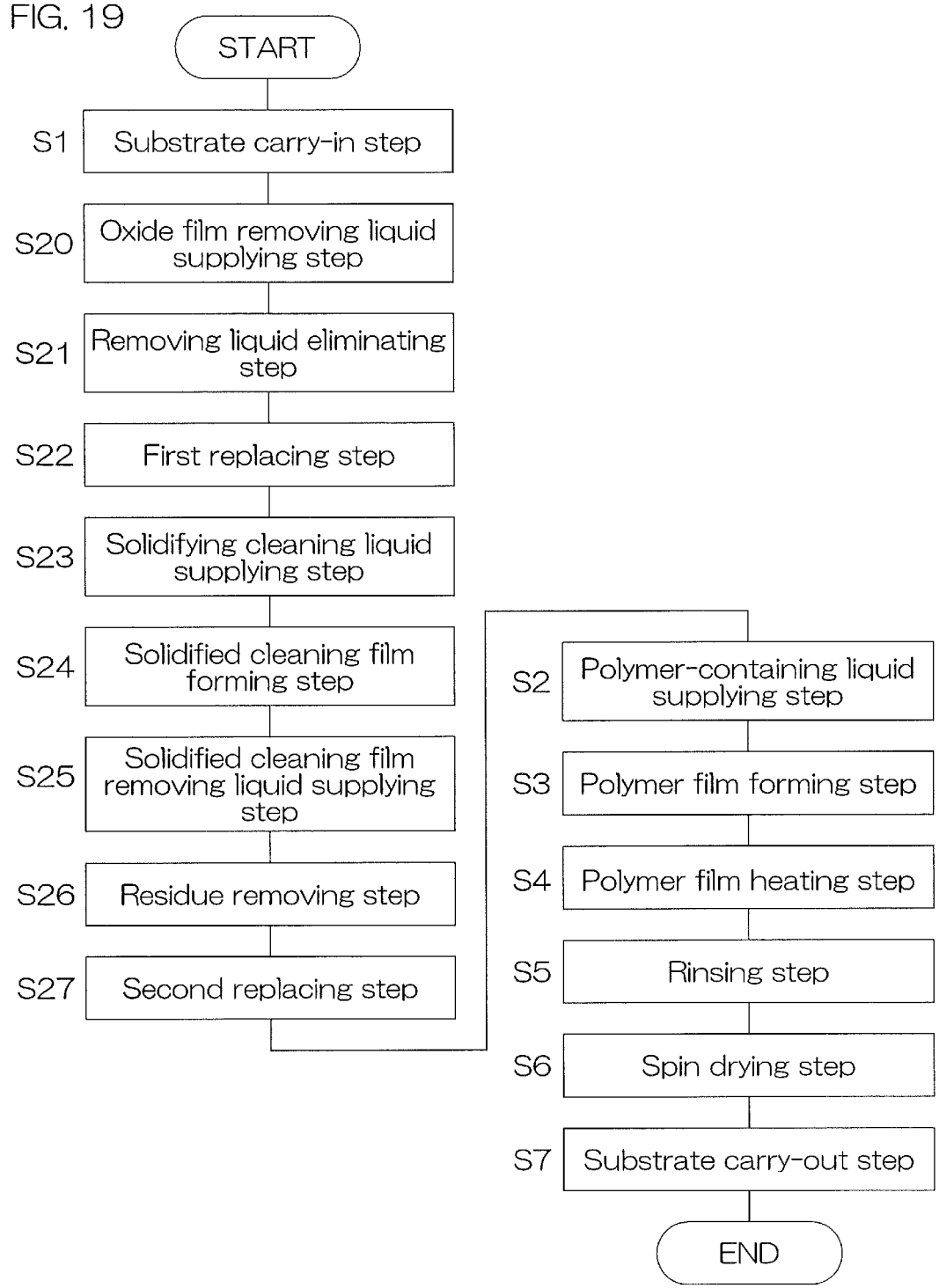
FIG. 19 is a flowchart for describing an example of substrate processing executed by the substrate processing apparatus according to the fourth preferred embodiment.

FIG. 19 is a flowchart for describing an example of substrate processing executed by the substrate processing apparatus 1R according to the fourth preferred embodiment.

Unlike in the substrate processing according to the first preferred embodiment (see FIG. 4), in the substrate processing according to the fourth preferred embodiment, an oxide film removing liquid supplying step (step S20), a removing liquid eliminating step (step S21), a first replacing step (step S22), a solidifying cleaning liquid supplying step (step S23), a solidified cleaning film forming step (step S24), a solidified cleaning film removing step (step S25), a residue removing step (step S26), and a second replacing step (step S27) are executed in that order between the substrate carry-in step (S1) and the polymer-containing liquid supplying step (step S2).

In the following, the substrate processing according to the fourth preferred embodiment shall be described briefly. With the substrate processing according to the fourth preferred embodiment, after the transfer robot CR has retreated outside the processing unit 2, the oxide film removing liquid is supplied from the oxide film removing liquid nozzle 150 to the upper surface of the substrate W and the oxide film exposed from the upper surface of the substrate W is removed (oxide film removing liquid supplying step: step S20). Thereafter, by the rinse liquid being supplied from the rinse liquid nozzle 9 to the upper surface of the substrate W, the oxide film removing liquid is eliminated from the upper surface of the substrate W (removing liquid eliminating step: step S21).

Thereafter, by the organic solvent being supplied from the organic solvent nozzle 153 to the upper surface of the substrate W, the rinse liquid on the substrate W is replaced by the organic solvent (first replacing step: step S22). Further thereafter, the solidifying cleaning liquid is supplied from the solidifying cleaning liquid nozzle 151 to the upper surface of the substrate W (solidifying cleaning liquid supplying step: step S23). By thereafter stopping the supply of the solidifying cleaning liquid to the upper surface of the substrate W and heating the substrate W in the rotating state with the heating fluid, the solidifying cleaning liquid on the substrate W is solidified to form the solidified cleaning film (solidified cleaning film forming step: step S24). Although the substrate W does not necessarily have to be heated in the solidified cleaning film forming step, the forming of the solidified cleaning film is promoted if the substrate W is heated.

After the solidified cleaning film has been formed, by supplying the solidified cleaning film removing liquid from the solidified cleaning film removing liquid nozzle 152 to the upper surface of the substrate W (solidified cleaning film removing liquid supplying step), the solidified cleaning film is peeled off and removed from the upper surface of the substrate W (solidified cleaning film removing step: step S25). After the solidified cleaning film has been removed from the upper surface of the substrate W, the organic solvent is supplied from the organic solvent nozzle 153 to the upper surface of the substrate W to remove residues of the solidified cleaning film from the upper surface of the substrate W (residue removing step: step S26). Thereafter, the rinse liquid is supplied from the rinse liquid nozzle 9 to the upper surface of the substrate W and the organic solvent on the upper surface of the substrate W is replaced by the rinse liquid (second replacing step: step S27).

Thereafter, the polymer-containing liquid supplying step (step S2) to the substrate carry-out step (step S7) are executed. By the substrate processing apparatus 1R according to the fourth preferred embodiment, metal foreign matters can be removed further by the action of the acidic polymer after sufficiently removing the oxide film and the particulate foreign matters from the upper surface of the substrate W. The upper surface of the substrate W can thus be cleaned even more satisfactorily.

According to the fourth preferred embodiment and in reference to FIG. 6A to FIG. 6C, the polymer film 101 of semisolid state is formed by rotating the substrate W supplied with the polymer-containing liquid. By the action of the acidic polymer in the polymer film 101 of semisolid state, the metal foreign matters 102 are pulled away from the major surface of the substrate W and adsorbed by the polymer film 101 (metal foreign matter adsorbing step). Thus, by forming the polymer film 101 by the polymer-containing liquid of the amount necessary to cover the entirety of the major surface of the substrate W and removing the polymer film 101 by the rinse liquid, the metal foreign matters 102 can be removed satisfactorily from the major surface of the substrate W without continuously supplying the polymer-containing liquid to the major surface of the substrate W.

Since the metal foreign matters 102 can therefore be removed sufficiently without immersing the substrate W in the polymer-containing liquid, the usage amount of the polymer-containing liquid can be reduced. The environmental burden can thereby be reduced.

According to the fourth preferred embodiment, since the pH of the polymer-containing liquid is not more than 1, the metal foreign matters 102 can be removed from the substrate W sufficiently even if the oxidizing agent is not contained in the polymer-containing liquid.

Also, with the fourth preferred embodiment, the particulate foreign matters can be removed using the solidified cleaning film. Thus, by using the solidifying cleaning liquid of a liquid amount that covers the upper surface of the substrate W, the particulate foreign matters can be removed without continuously supplying the liquid for removing the particulate foreign matters in a continuous flow. The usage amount of the liquid can therefore be reduced.

Also, the solidified cleaning film formed on the upper surface of the substrate W is peeled off from the major surface of the substrate and removed from the upper surface of the substrate W by the solidified cleaning film removing liquid. Since the solidified cleaning film is of solid state or semisolid state, it can hold the particulate foreign matters adhered to the upper surface of the substrate W. Since the solidified cleaning film is peeled off from the upper surface of the substrate W in the state of holding the foreign matters, the particulate foreign matters can be removed together with the solidified cleaning film. Due to the particulate foreign matters being held by the solidified cleaning film, a kinetic energy received from the solidified cleaning film removing liquid flowing on the upper surface of the substrate W increases more than a kinetic energy that particulate foreign matters not held by the solidified cleaning film receive from the solidified cleaning film removing liquid. The particulate foreign matters can thus be removed effectively from the upper surface of the substrate W.

By executing the solidification cleaning, the particulate foreign matters that have properties different from the metal foreign matters and are difficult to remove from the substrate W by the action of the acidic polymer in the polymer film can be removed effectively.

By using the substrate processing apparatus 1R according to the fourth preferred embodiment, it is also possible to execute, unlike in the substrate processing shown in FIG. 19, the substrate rotation stopping step (step S10) (see FIG. 7) in place of the polymer film heating step (step S4).

<Removal Efficiency Measurement Experiment>

Figure 20:
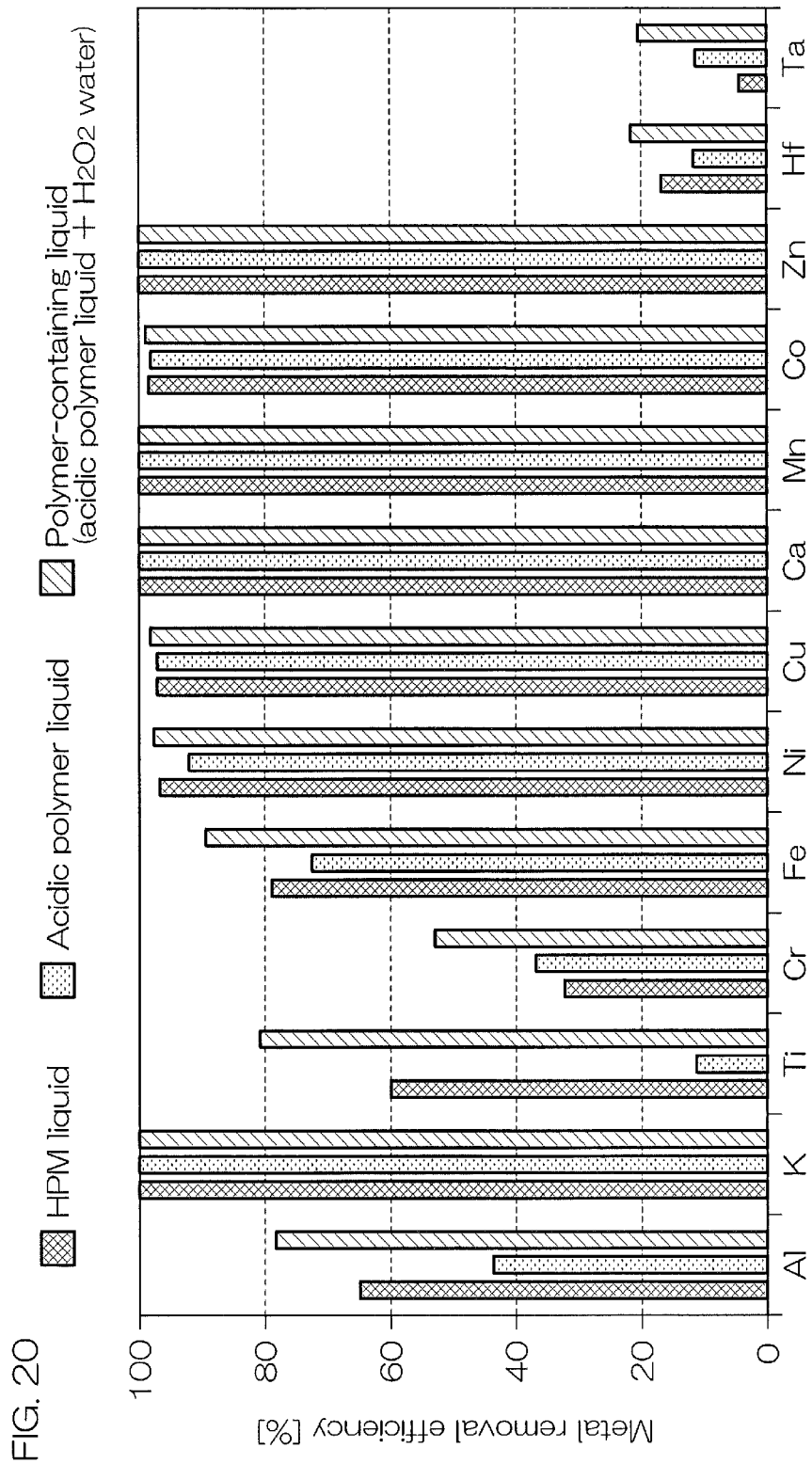
FIG. 20 is a graph showing results of an experiment of measuring metal removal efficiencies of polymer films.

FIG. 20 is a graph showing results of an experiment (first removal efficiency measurement experiment) of measuring metal removal efficiencies [%] of polymer films.

In the first removal efficiency measurement experiment, 13 types of substrates having 13 types of metal foreign matters adhered thereto respectively were prepared and for each type of substrate, metal removal efficiencies in cases of using three types of liquids, namely, an HPM liquid, an acidic polymer liquid, and a polymer-containing liquid (mixed liquid of acidic polymer liquid and hydrogen peroxide water) were measured.

In detail, in the first removal efficiency measurement experiment, each measurement of removal efficiency was made after supplying the HPM liquid, the acidic polymer liquid, or the polymer-containing liquid to a major surface of a substrate and thereafter performing rinsing of the major surface of the substrate with DIW and drying of the major surface of the substrate. For the measurement of removal efficiency, a degree of removal of metal foreign matters (removal efficiency) was checked using total reflection X-ray fluorescence analysis (TXRF). When the acidic polymer liquid or the polymer-containing liquid was used, a step of forming a polymer film on the major surface of the substrate was performed before the rinsing with DIW.

A concentration of the acidic polymer liquid used as a liquid in the present experiment is 10% by mass (wt %). A concentration of the hydrogen peroxide water used in the present experiment is 30% by mass (wt %). A mixing ratio of the hydrogen peroxide water and the acidic polymer liquid in the polymer-containing liquid is 1:6 as volume ratio.

According to the present experimental results, when the metal foreign matters are of any of aluminum (Al), titanium (Ti), chromium (Cr), iron (Fe), nickel (Ni), copper (Cu), cobalt (Co), hafnium (Hf), and tantalum (Ta), the result that the metal removal efficiency when the polymer-containing liquid is used is high in comparison to that when the HPM liquid is used was obtained. Even in cases where the metal foreign matters are of a metal species other than the above, the results that the metal removal efficiency by the polymer-containing liquid is equivalent to the removal efficiency of the HPM liquid were obtained.

Based on the first removal efficiency measurement experiment, the polymer film formed from the mixed liquid of the acidic polymer liquid and the hydrogen peroxide water, that is, the polymer-containing liquid is inferred to be high in removing power of removing metal foreign matters in comparison to the HPM liquid. In more detail, the high level of removal efficiency of the polymer-containing liquid is believed to be due to the action on the metal foreign matters of the acidic polymer that, by the forming of the polymer film, became higher in concentration than it was in the polymer-containing liquid.

On the other hand, when the metal foreign matters are of any of aluminum (Al), titanium (Ti), iron (Fe), nickel (Ni), copper (Cu), cobalt (Co), hafnium (Hf), and tantalum (Ta), the result that the metal removal efficiency when the acidic polymer liquid is used is low in comparison to that when the HPM liquid is used was obtained. From these results, it is suggested that even when the acidic polymer is made to act on the metal foreign matters, the synergistic effect with the oxidizing agent such as the hydrogen peroxide water, etc., is important.

Figure 21:
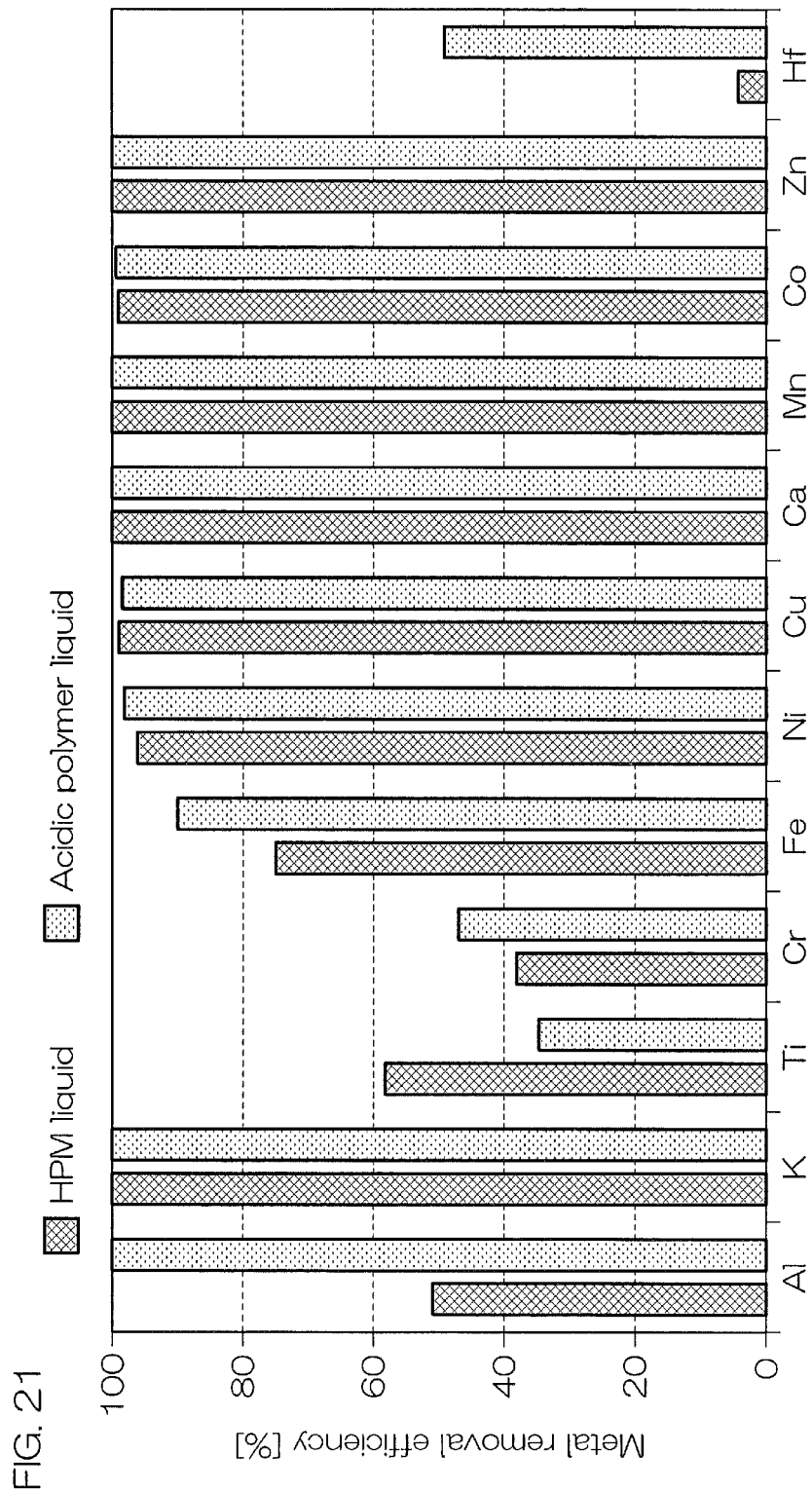
FIG. 21 is a graph showing results of an experiment of measuring metal removal efficiencies of polymer films.

FIG. 21 is a graph showing results of an experiment (second removal efficiency measurement experiment) of measuring metal removal efficiencies of polymer films in cases of using an acidic polymer of higher acidity than the acidic polymer used in the first removal efficiency measurement experiment shown in FIG. 20.

In detail, in the second removal efficiency measurement experiment, 12 types of substrates having 12 types of metal foreign matters adhered thereto respectively were prepared and for each type of substrate, metal removal efficiencies in cases of using two types of liquids, namely, the HPM liquid and an acidic polymer liquid were measured. The 12 types of metal foreign matters are the 12 types of metal foreign matters excluding those of tantalum among the 13 types of metal foreign matters used in the first removal efficiency measurement experiment.

Each measurement of removal efficiency was made after supplying the HPM liquid or the acidic polymer liquid to the major surface of a substrate and thereafter performing rinsing of the major surface of the substrate with DIW and drying of the major surface of the substrate. For the measurement of removal efficiency, the removal efficiency was checked using TXRF. When the acidic polymer liquid was used, the step of forming a polymer film on the major surface of the substrate was performed before the rinsing with DIW. A pH of the acidic polymer liquid used in the second removal efficiency measurement experiment is 1 and a pH of the acidic polymer liquid used in the first removal efficiency measurement experiment is 3. A concentration of the acidic polymer liquid used as a liquid in the present experiment is 10% by mass (wt %).

According to the present experimental results, with the exception of the case where the metal foreign matters are of titanium (Ti), the result that the metal removal efficiency is approximately the same as that when the HPM liquid is used or that the metal removal efficiency is higher than that when the HPM liquid is used was obtained in each case of using the acidic polymer liquid. Based on the results of the second removal efficiency measurement experiment, it is inferred that if the acidity of the acidic polymer liquid is sufficiently high, metal foreign matters can be removed sufficiently with a polymer film formed from the acidic polymer liquid.

Other Preferred Embodiments

The present invention is not restricted to the preferred embodiments described above and can be implemented in yet other modes.

For example, in the first preferred embodiment, after the polymer film 101 has been formed on the substrate W, the substrate W may be heated while the polymer film 101 is left to stand on the substrate W by stopping the rotation of the substrate W.

Also, the heating of the polymer film 101 on the substrate W is not restricted to heating by the heating fluid supplying unit 13 and heating by the heater unit 6. Specifically, the polymer film 101 on the substrate W may be heated by an infrared lamp that faces the upper surface of the substrate W or a heater that faces the upper surface of the substrate W.

Also, unlike in the respective preferred embodiments described above, an arrangement may be made to form the polymer film 101 on the lower surface of the substrate W.

Also, unlike in the respective preferred embodiments described above, an alkaline component such as ammonia, etc., may be contained in the polymer-containing liquid. By the presence of the alkaline component, the pH of the polymer-containing liquid is increased and an adsorption power of the acidic polymer with respect to metal foreign matters is suppressed. The suppression of the adsorption power of the acidic polymer continues even after the polymer film 101 is formed. However, in the polymer film heating step, by heating the polymer film 101, the alkaline component in the polymer film 101 evaporates (volatilizes) together with the solvent and the adsorption action on metal foreign matters by the acidic polymer in the polymer film 101 is expressed.

The alkaline component is not restricted to ammonia and suffices to be a component that evaporates at the heating temperature (of not less than 60° C. but less than 150° C.) in the polymer film heating step and exhibits alkalinity in the solvent. Specifically, the alkaline component includes, for example, ammonia, tetramethylammonium hydroxide (TMAH), dimethylamine, or a mixture of these.

Although with the preferred embodiments described above, there are cases where respective arrangements are represented schematically as blocks, the shapes, sizes, and positional relationships of the respective blocks do not represent the shapes, sizes, and positional relationships of the respective arrangements.

Also, with the preferred embodiments described above, each of the substrate processing apparatuses 1, 1P, and 1Q includes the transfer robots IR and CR, the plurality of processing units 2, and the controller 3. However, each of the substrate processing apparatuses 1, 1P, and 1Q may instead be arranged from a single processing unit 2 and the controller unit 3 and does not have to include the transfer robots IR and CR. Or, each of the substrate processing apparatuses 1, 1P, and 1Q may be arranged from just a single processing unit 2. In other words, the processing unit 2 may be an example of a substrate processing apparatus.

Also, in FIG. 2, FIG. 9 to FIG. 11, and FIG. 13 to FIG. 18 not all of the pipings, pumps, valves, nozzle moving units, etc., are necessarily illustrated and this does not preclude the providing of these members at appropriate positions.

While preferred embodiments of the present invention have been described in detail above, these are merely specific examples used to clarify the technical contents of the present invention, and the present invention should not be interpreted as being limited only to these specific examples, and the scope of the present invention shall be limited only by the appended claims.

The present application corresponds to Japanese Patent Application No. 2021-046459 filed on Mar. 19, 2021 in the Japan Patent Office and Japanese Patent Application No. 2021-211618 filed on Dec. 24, 2021 in the Japan Patent Office, and the entire disclosures of these applications are incorporated herein by reference.

REFERENCE SIGNS LIST

1: substrate processing apparatus
1P: substrate processing apparatus
2: processing unit (substrate processing apparatus)
5: spin chuck
8: polymer-containing liquid nozzle
9: rinse liquid nozzle
80: polymer-containing liquid tank
101: polymer film
102: metal foreign matter
105: acidic polymer
W: substrate

The invention claimed is:

1. A substrate processing method comprising:
supplying, to a major surface of a substrate, a polymer-containing liquid that contains an acidic polymer and a solvent dissolving the acidic polymer;
rotating the substrate to coat and solidify the polymer-containing liquid so as to form a polymer film containing the acidic polymer, on the major surface of the substrate;
by use of the acidic polymer in the polymer film, pulling a metal foreign matter adhered to the major surface of the substrate away from the major surface of the substrate and adsorbing the foreign matter by the polymer film; and
supplying, to the major surface of the substrate, a rinse liquid that cleans the major surface of the substrate on which the polymer film is formed.

2. The substrate processing method according to claim 1, wherein the polymer-containing liquid further contains an oxidizing agent that is dissolved in the solvent, and
the polymer film formed on the major surface of the substrate further contains the oxidizing agent.

3. The substrate processing method according to claim 2, wherein the polymer-containing liquid is a mixed liquid in which an acidic polymer liquid containing the acidic polymer at 10 wt % and a liquid oxidizing agent containing the oxidizing agent at 30 wt % are mixed at a volume ratio of 1:6.

4. The substrate processing method according to claim 1, wherein solidifying the polymer-containing liquid includes evaporating a portion of the solvent in the polymer-containing liquid.

5. The substrate processing method according to claim 1, wherein the rinse liquid removes the polymer film from the major surface of the substrate.

6. The substrate processing method according to claim 1, further comprising: heating the polymer film after the polymer film has been formed on the major surface of the substrate.

7. The substrate processing method according to claim 6, wherein heating the polymer film includes heating the polymer film via the substrate by heating the substrate by supplying a heating fluid to an opposite surface at an opposite side to the major surface of the substrate while rotating the substrate.

8. The substrate processing method according to claim 1, further comprising: stopping the rotation of the substrate for a predetermined time after the polymer film has been formed on the major surface of the substrate.

9. The substrate processing method according to claim 1, further comprising:
storing the polymer-containing liquid in a polymer-containing liquid tank; and
wherein supplying the polymer-containing liquid includes supplying the polymer-containing liquid from the polymer-containing liquid tank to a polymer-containing liquid nozzle and discharging the polymer-containing liquid toward the major surface of the substrate from the polymer-containing liquid nozzle.

10. The substrate processing method according to claim 1, wherein the polymer-containing liquid further contains a conductive polymer that is dissolved in the solvent, and
the polymer film formed on the major surface of the substrate further contains the conductive polymer.

11. The substrate processing method according to claim 1, further comprising:
forming a solidified cleaning film of solid or semisolid form on the major surface of the substrate before supplying the polymer-containing liquid; and
supplying, to the major surface of the substrate before supplying the polymer-containing liquid, a solidified cleaning film removing liquid by which the solidified cleaning film is peeled off from the major surface of the substrate and removed from the major surface of the substrate.

12. A substrate processing method comprising:
supplying, to a major surface of a substrate, a polymer-containing liquid that contains an acidic polymer, a solvent dissolving the acidic polymer and an oxidizing agent that is dissolved in the solvent;
rotating the substrate to coat and solidify the polymer-containing liquid so as to form a polymer film, containing the acidic polymer, on the major surface of the substrate;
by action of the acidic polymer in the polymer film, pulling a metal foreign matter adhered to the major surface of the substrate away from the major surface of the substrate and absorbing the foreign matter by the polymer film;
promoting the adsorption of the metal foreign matter by the acidic polymer by an action of the oxidizing agent in the polymer film; and supplying, to the major surface of the substrate, a rinse liquid that cleans the major surface of the substrate on which the polymer film is formed.

\* \* \* \* \*